(12) United States Patent
Hill et al.

(10) Patent No.: US 11,335,620 B2
(45) Date of Patent: May 17, 2022

(54) PACKAGE INDUCTOR HAVING THERMAL SOLUTION STRUCTURES

(71) Applicant: Intel Corporation, Santa Clara, CA (US)

(72) Inventors: Michael J. Hill, Gilbert, AZ (US);
Anne Augustine, Chandler, AZ (US);
Huong Do, Chandler, AZ (US);
William Lambert, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 795 days.

(21) Appl. No.: 16/035,129

(22) Filed: Jul. 13, 2018

(65) Prior Publication Data
US 2020/0020652 A1    Jan. 16, 2020

(51) Int. Cl.
| | |
|---|---|
| *H01L 23/367* | (2006.01) |
| *H01L 23/64* | (2006.01) |
| *H01L 23/32* | (2006.01) |
| *H01L 23/498* | (2006.01) |
| *H01L 23/00* | (2006.01) |
| *H01L 21/48* | (2006.01) |
| *H01L 23/522* | (2006.01) |

(52) U.S. Cl.
CPC ...... *H01L 23/3672* (2013.01); *H01L 21/4853* (2013.01); *H01L 21/4857* (2013.01); *H01L 21/4882* (2013.01); *H01L 23/32* (2013.01); *H01L 23/49822* (2013.01); *H01L 23/49827* (2013.01); *H01L 23/49838* (2013.01); *H01L 23/5227* (2013.01); *H01L 23/645* (2013.01); *H01L 24/16* (2013.01); *H01L 2224/16225* (2013.01); *H01L 2924/1427* (2013.01); *H01L 2924/19042* (2013.01); *H01L 2924/19103* (2013.01)

(58) Field of Classification Search
CPC ... H01L 23/645; H01L 23/32; H01L 23/3672; H01L 23/49822; H01L 23/49838; H01L 24/16; H01L 21/4857; H01L 21/4882; H01L 21/4853; H01L 2924/1427; H01L 2224/16225; H01L 2924/19103; H01L 2924/19042; H01L 28/10; H01L 27/0288; H01L 2924/1206; H01L 23/12; H01L 23/36; H01L 23/367; H01L 23/3675; H01L 23/3677; H01L 23/481; H01L 23/485; H01L 23/498; H01L 23/49827; H01L 23/5227; H01L 2223/6655
See application file for complete search history.

(56) References Cited

U.S. PATENT DOCUMENTS 6,437,438 B1 * 8/2002 Braasch ................ H01L 23/367
257/701
6,504,723 B1 * 1/2003 Fitzgerald ........... H01L 23/3675
257/713

(Continued)

*Primary Examiner* — Eduardo A Rodela
(74) *Attorney, Agent, or Firm* — Essential Patents Group, LLP.

(57) ABSTRACT

Embodiments include a microelectronic device package structure having an inductor at least partially embedded within a substrate. At least one thermal solution structure may be on a surface of the inductor, and may be thermally coupled with the inductor. The one or more thermal solution structures provide a thermal pathway for cooling for the inductor, and extend a thermal time constant of the inductor.

16 Claims, 17 Drawing Sheets

(56) References Cited

U.S. PATENT DOCUMENTS

| | | | |
|---|---|---|---|
| 7,339,798 B2* | 3/2008 | Chakravorty | H01L 23/50 |
| | | | 361/782 |
| 9,515,003 B1* | 12/2016 | Fitzgerald | H01L 28/10 |
| 10,325,891 B1* | 6/2019 | Lim | H01L 23/5383 |
| 2011/0134613 A1* | 6/2011 | Moussaoui | H01L 23/49575 |
| | | | 361/737 |
| 2015/0228416 A1* | 8/2015 | Hurwitz | H01G 4/1209 |
| | | | 361/763 |
| 2017/0085228 A1* | 3/2017 | Abdo | H03F 1/565 |
| 2018/0096777 A1* | 4/2018 | Akcasu | H01G 4/33 |
| 2020/0006287 A1* | 1/2020 | Hill | H01L 23/645 |
| 2020/0015348 A1* | 1/2020 | Hill | H01L 21/486 |
| 2020/0185299 A1* | 6/2020 | Chang | H01L 24/19 |

* cited by examiner

PACKAGE INDUCTOR HAVING THERMAL SOLUTION STRUCTURES

TECHNICAL FIELD

Embodiments of the present description generally relate to the field of microelectronic packaging, and, more particularly, to microelectronic packages having inductors with thermal solution structures.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like. Mobile products, such as cell phones, for example, often have microelectronic packages which include high power devices. Package structures supporting such high-power devices need to possess mechanical and thermal properties that can manage high power device operational requirements. Integrated circuit dice associated with package structures may comprise a portion of a voltage regulator circuitry, where voltage and current require precise control during operation. For example, a die, such as a processor die, may be on and/or at least partially within a package substrate, and may be electrically coupled to an embedded inductor within a package substrate, where the inductor and die comprise portions of the voltage regulator circuitry.

Such inductors which are coupled with die circuitry may limit processor current level capabilities, in order to avoid a thermally induced damage to the inductors, which may be caused by exceeding inductor current limits. This reduction in processor current levels can result in reduced processor performance, since the processor may be capping its current level or time in a turbo mode, for example, to accommodate inductor current limits.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
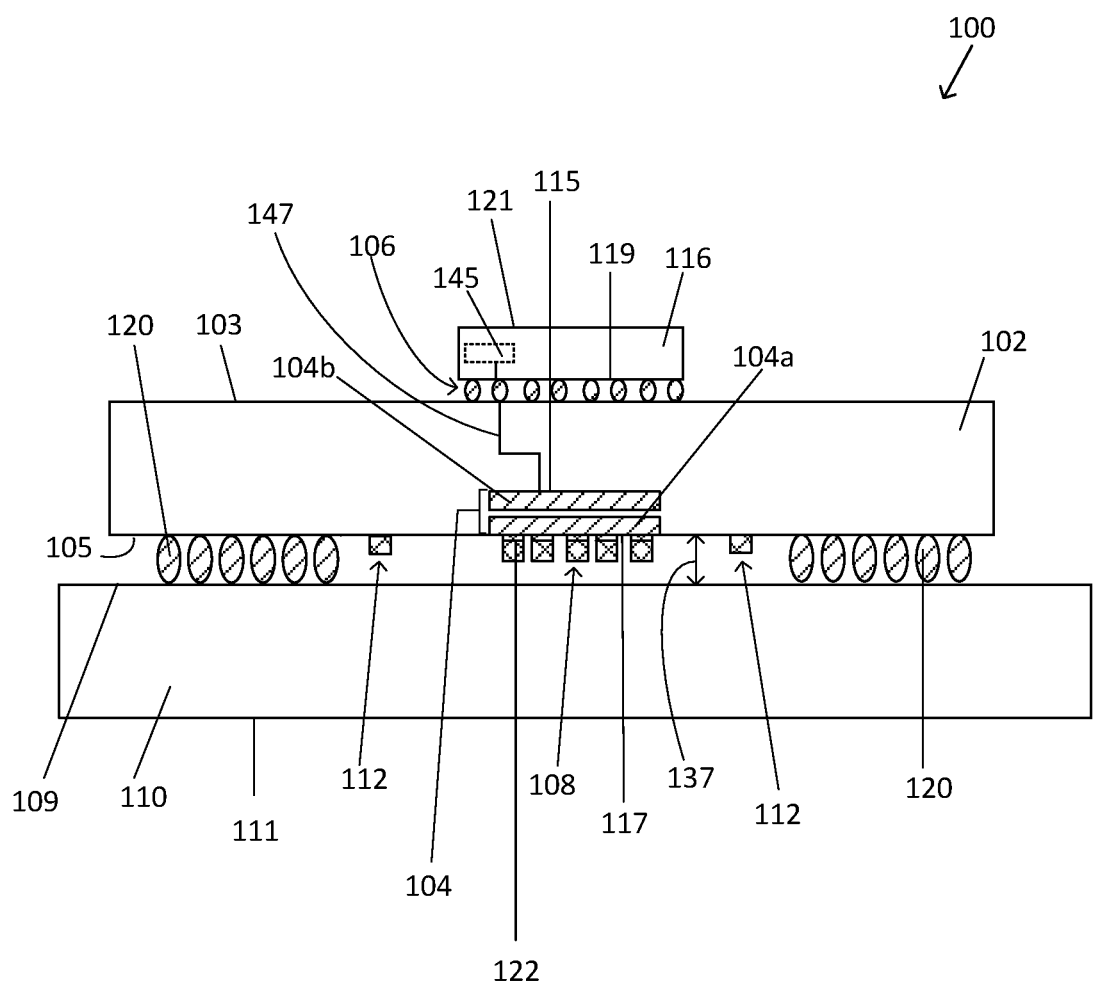
FIG. 1A illustrates a cross-sectional view of a package structure having thermal solution structures, according to embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the embodiments herein may be practiced without these specific details. In some instances, well-known methods and devices are shown in block diagram form, rather than in detail, to avoid obscuring the embodiments herein. Reference throughout this specification to "an embodiment" or "one embodiment" or "some embodiments" means that a particular feature, structure, function, or characteristic described in connection with the embodiment is included in at least one embodiment herein. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "circuit" or "module" may refer to one or more passive and/or active components that are arranged to cooperate with one another to provide a desired function. The term "signal" may refer to at least one current signal, voltage signal, or magnetic signal. The terms "substantially", "close", "approximately", "near", and "about" generally refer to being within +/−10 percent of a target value.

Various implementations of the embodiments herein may be formed or carried out on a substrate, such as a package substrate. In some embodiments, a package substrate may comprise any suitable type of substrate capable of providing electrical communications between an electrical component, such as an integrated circuit (IC) die, and a next-level component to which an IC package may be coupled (such as a circuit board, for example). In other embodiments, the substrate may comprise any suitable type of substrate capable of providing electrical communication between an IC die and an upper IC package coupled with a lower IC/die package, and in some embodiments, a substrate may comprise any suitable type of substrate capable of providing electrical communication between an upper IC package and a next-level component to which an IC package is coupled.

A substrate may also provide structural support for a device, such as a die. By way of example, in some embodiments, a substrate may comprise a multi-layer substrate—including alternating layers of a dielectric material and metal—built-up around a core layer (either a dielectric or a metal core), and may include through via structures that extend through the core. In other embodiments, a substrate may comprise a coreless multi-layer substrate, in which case through via structures may be absent. Other types of substrates and substrate materials may also find use with the disclosed embodiments (e.g., ceramics, sapphire, glass, etc.). Further, according to some embodiments, a substrate may comprise alternating layers of dielectric material and metal that are built-up over a die itself—this process is sometimes referred to as a "bump-less build-up process." Where such an approach is utilized, conductive interconnects may or may not be needed (as the build-up layers may be disposed directly over a die/device, in some cases).

A die may include a front-side and an opposing back-side, and may be an integrated circuit die and/or an integrated circuit device, in some embodiments. In some embodiments, the front-side may be referred to as the "active surface" of the die. A number of interconnects may extend from the die's front-side to an underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some embodiments, a die may be disposed on a substrate in a flip-chip arrangement. In some embodiments, interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be on the terminals of a substrate and/or die, and these terminals may then be joined using a solder reflow process, for example. Of course, it should be understood that many other types of interconnects and materials are possible (e.g., wirebonds extending between a die and a substrate). In some embodiments herein, a die may be coupled with a substrate by a number of interconnects in a flip-chip arrangement. However, in other embodiments, alternative structures and/or methods may be utilized to couple a die with a substrate.

Described herein are microelectronic packaging structures having an inductor at least partially embedded in a substrate, and where a die, which may comprise an integrated circuit die, may be on a first side of the substrate. The inductor may comprise an air core inductor. In an embodiment, the air core inductor may comprise a series of conductive coils/windings, which surround a non-ferromagnetic material, such as a dielectric material, for example, and do not possess a ferromagnetic core material. The inductor described herein, may be electrically coupled to voltage regulator circuitry located in the die, where the die and the associated voltage regulator circuitry may comprise portion of a voltage regulator. In an embodiment, the voltage regulator may comprise a fully integrated voltage regulator (FIVR).

In an embodiment, a surface of the inductor is substantially coplanar with a second side of the substrate, although the inductor may be fully embedded within the substrate, in some other embodiments. In an embodiment, surface portions of the one or more of the inductors may comprise one or more thermal solution structures coupled thereto. The thermal solution structures may comprise any suitable thermal solution structure, such as, but not limited to, a thermal mass structure and/or a heat sink structure, for example. A board, such as a motherboard, for example, may be coupled to the substrate. The thermal solution structures provide for cooling of the inductor. By incorporating one or more the thermal solution structures onto the surface of an inductor, a temperature of the inductor may be cooled to allow larger currents and more power to be delivered to a die during peak current demand while the device is operational.

Some embodiments include a substrate coupled with a die, which may be an integrated circuit die, where the die is on a first side of the substrate. An inductor may be on a second side of the substrate, opposite the first side of the substrate. The inductor may be at least partially embedded within the substrate, in an embodiment. In another embodiment, the inductor may have a surface that is substantially coplanar with the second side of the substrate. One or more thermal solution structures may be on a surface of the inductor. The one or more thermal solutions may extend into a cavity of a board, where the board is electrically coupled with the substrate, in an embodiment. The one or more thermal solution structures provide a thermal path for cooling the inductor.

FIG. 1A is a cross-sectional view of a package structure 100, arranged in accordance with some embodiments of the present disclosure, having thermal solutions, such as thermal mass structures and/or thermal heat sink structures on the surface of at least one of an inductor that is at least partially embedded within the substrate. The package structure 100 includes one or more dice 116 electrically and physically coupled to a first side 103 of a portion of a substrate 102. The substrate 102 may comprise a portion of a system in package substrate, a printed circuit board, or any other suitable substrate according to a particular application. The substrate 102 may include such materials as phenolic cotton paper (e.g., FR-1), cotton paper and epoxy materials (e.g., FR-3), woven glass materials that are laminated together using an epoxy resin (e.g., FR-4), glass/paper with epoxy resin (e.g., CEM-1), glass composite with epoxy resin, woven glass cloth with polytetrafluoroethylene (e.g., PTFE CCL), or other polytetrafluoroethylene based prepreg material.

The substrate 102 may include conductive interconnect structures/routing layers (not shown) that are within dielectric layer(s), which may be configured to route electrical signals between any number of dice 116 and the substrate 102, in some embodiments. For example, interconnect structures may include routing structures such as pads or traces configured to receive electrical signals to and from devices that may be on or within the substrate 102. In some embodiments, individual ones of the conductive interconnect structures/routing layers comprise trenches, ground planes, power planes, re-distribution layers (RDLs), and/or any other appropriate electrical routing features. The dielectric layers and the conductive layers/structures within and on the dielectric layers of the substrate 102 are sometimes referred to as a "package substrate." The substrate 102 may also provide structural support for discrete components and/or any other type of device electrically coupled to the substrate 102.

Various types of substrates and substrate materials may find use with the disclosed embodiments (e.g., ceramics, sapphire, glass, etc.). The substrate 102 may be any substrate known to be suitable for one or more of flip-chip packages (FCBGA), package-on-package (PoP), system-in-package (SiP), or the like.

The die 116 may be an integrated circuit, or any other type of suitable die. In some embodiments, the die 116 may be any type of die which consumes a large amount of power, such as a die requiring more than 1 Watt to operate (such as a system on a chip) for example. Such die may generate a significant amount of heat, and may require sufficient cooling to maintain an acceptable operating environment, in order to avoid adversely affecting the operations of the die 116, and possibly neighboring die/components that may be adjacent the die 116 on the substrate 102.

The die 116 may be any type of integrated device or integrated component that may be included within an electronic device package. In some embodiments, the die 116 includes a processing system (either single core or multi-core). In some embodiments, the die 116 may be a microprocessor, a graphics processor, a signal processor, a network processor, a chipset, a memory device etc. In some embodiments, the die 116 be a system-on-chip (SoC) having multiple functional units (e.g., one or more processing units, one or more graphics units, one or more communications units, one or more signal processing units, one or more security units, etc.). The die 116 may comprise circuitry 145 related to voltage regulation, and may comprise circuitry to precisely control voltage supplied to the package structure 100, and to allow parts of the die 116 to be turned off or turned down to save power and to reduce the generation of heat.

In some embodiments, the die 116 may be attached to the first side 103 of the substrate 102 according to a variety of suitable configurations including a flip chip configuration, or any other suitable attachment configuration. In the flip chip configuration, a first side 119 of the die 116 may be an active side 119 of the die 116, and may be attached to the first side 103 of the substrate 102, using interconnect features 106, which may comprise such conductive features as bumps or pillars, which serve to route electrical signals, such as I/O, power and/or ground signals, associated with the operation of the die 116. In some embodiments, the wire bonding or the flip chip connections may comprise conductive materials such as copper, gold and nickel. A second side 121 of the die 116 is opposite the first side 119. The second side 121 of the die 116 may be coupled to a thermal solution, such as a heat sink, for example (not shown).

In an embodiment, solder interconnect structures 120, which are adjacent a footprint of the die 116, may electrically couple a second side 105 of the substrate 102 to a first side 109 of a board 110. The solder interconnect structures 120 may comprise conductive materials such as solder materials, copper, gold and/or nickel. The solder interconnect structures 120 may comprise an array of ball grid array (BGA) structures disposed on the second side 105 of the substrate 102, and may be located in a peripheral portion of the substrate 102, adjacent to the die 116, in an embodiment. The board 110 may be a motherboard, a printed circuit board, or any other suitable type of board substrate 110, and wherein a second side of the board 111 may be opposite the first side of the board 109. In an embodiment, discrete components 112 may be adjacent the solder interconnect structures 120, and may be on the second side 105 of the substrate 102. In an embodiment the discrete components 112 may comprise a discrete capacitor or a discrete resistor for example.

One or more inductors 104 may be at least partially embedded within the substrate 102, and may be located beneath the die 116 shadow, and may be within a die footprint. The inductor 104 may comprise a first side 117 and a second side 115. The inductor 104 may comprise any number of conductive layers (windings), such as a first conductive layer 104*a* and a second conductive layer 104*b*, for example. In an embodiment, the conductive layers 104*a*, 104*b* of the inductor 104 may comprise copper, or any other suitable conductive material. The inductor 104 may comprise an air core inductor (ACI) in an embodiment, and may comprise a portion of an integrated voltage regulator, such as a FIVR, for example. The second conductive layer 104*b* may be completely, or at least partially, embedded within the substrate 102, while the first conductive layer 104*a* may be at least partially exposed to the ambient environment. In an embodiment, the first side 117 of the inductor 104 may be substantially coplanar with the second side 105 of the substrate 102. In other embodiments, a solder material (not shown), may be on the first side 117 of the inductor 104. In an embodiment, the inductor 104 may be within the footprint of the die 116.

The inductor 104 may be electrically coupled to the die 116 voltage regulator circuitry 145 by an electrical/signal trace 147 (which may comprise any number of electrical traces) within the package substrate 102. In an embodiment, the die 116 and the inductor 104 may comprise a portion of a FIVR. The signal trace 147 is depicted as a single signal trace, however the signal trace 147 may comprise any suitable geometry and may be located in any suitable location within the substrate 102. The signal trace 147 may comprise a conductive material such as, but not limited to, copper and/or copper alloys, for example.

Figure 1B:
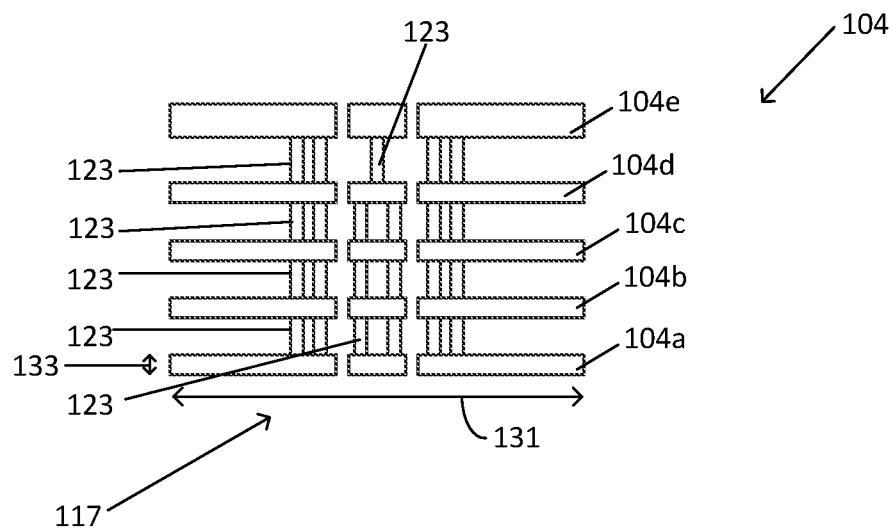
FIGS. 1B-1D illustrates a cross-sectional view, and side perspective views, respectively, of inductor structures, according to embodiments.
Figure 1C:
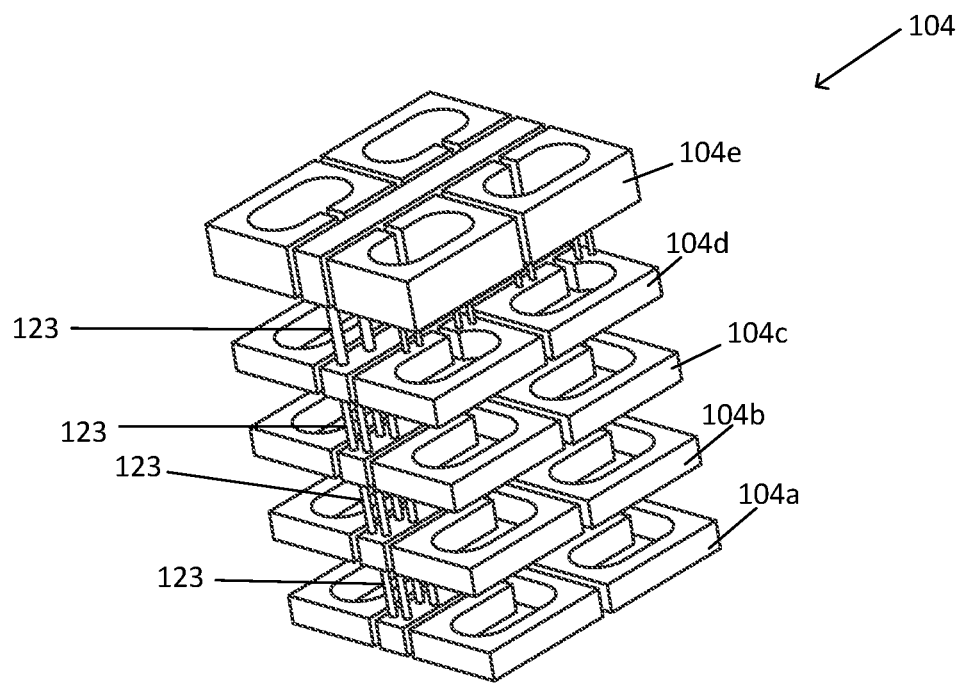
Figure 1D:
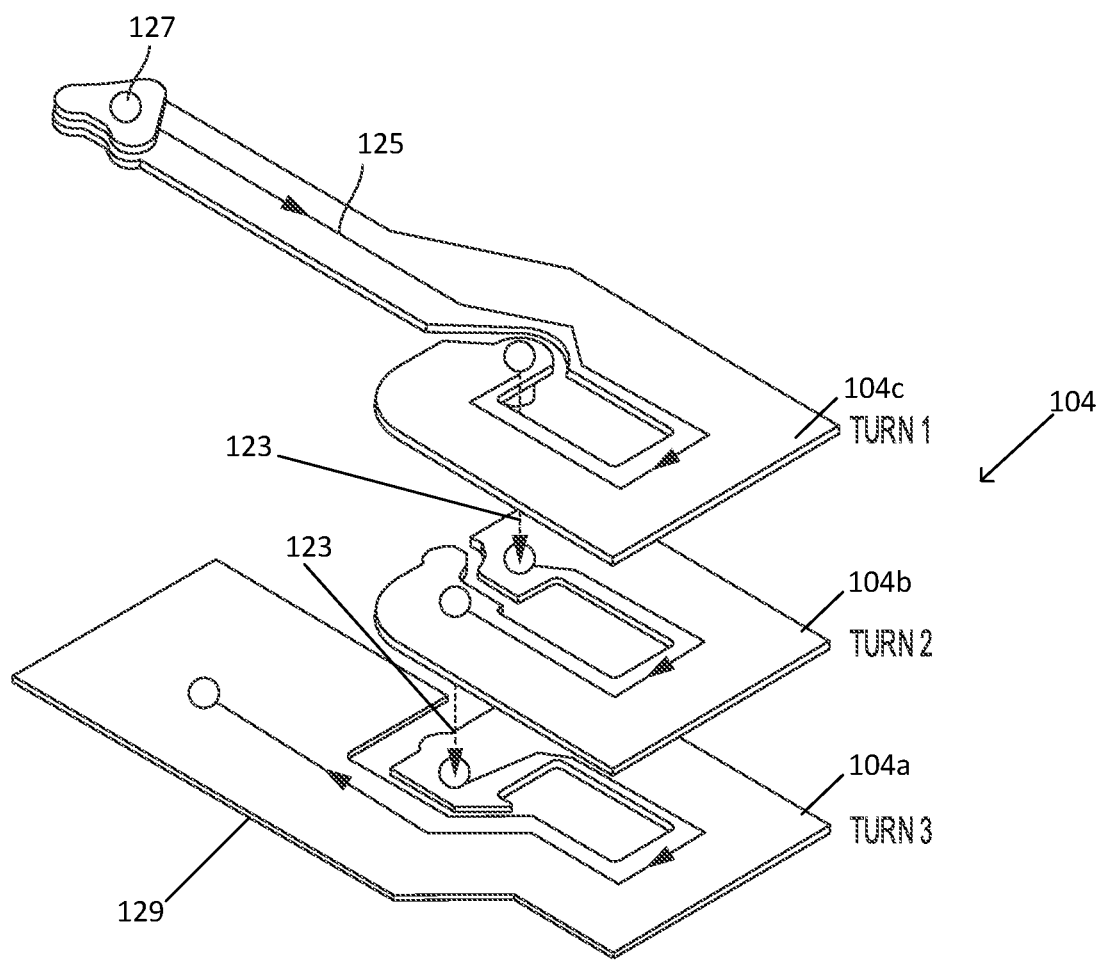

FIGS. 1B-1D depict embodiments of an inductor. In FIG. 1D (cross-sectional view), an inductor 104 comprises five conductive layers 104a, 104b, 104c, 104d, 104e. In an embodiment, the conductive layers 104a-104e may comprise windings of an ACI, which may be connected in series, such that the output of one layer is the input of the next. Conductive via structures 123 physically and electrically couple each of the individual layers 104a-104e to each other. In an embodiment, the conductive via structures 123 may comprise materials such as copper, for example. In some embodiments, the inductor 104 may comprise any number of conductive layers, and may comprise any number of via structures 123 coupling individual conductive layers to each other. In an embodiment, a first side 117 of the first conductive layer of the inductor 104a (which may comprise a first side 117 of the inductor 104 of FIG. 1A, for example) may comprise a length 131, and a width 133. The length 131 and width 133 may vary according to the particular design of the inductor 104, and in some embodiments, a particular inductor 104 may comprise a variety of shapes, such as a circular shape, or an irregular shape, for example.

FIG. 1C depicts a side perspective view of an embodiment of an inductor 104, wherein each of the individual layers 104a-104e are physically coupled to each other by the via structures 123, where the via structures 123 are substantially perpendicular to the orientation of the individual layers 104a-104e of the inductor 104. FIG. 1D depicts a side perspective view of an embodiment of inductor structure 104, where the inductor 104 comprises conductive layers 104a, 104b, 104c, which may comprise turns of the inductor (turn 1, turn 2, turn 3, for example.) The inductor 104 conductive layers may comprise copper, or any suitable conductive material, and may be coupled to each other by one or more via structures 123, which are orthogonal to the plane of the conductive layers 104a-104c. A direct current (DC) current path 125 flows from a switch node located on the die 116, through the conductive layers 104a-104c. The conductive layer 104c is electrically coupled to the switch node connection 127. An output plane 129 may be coupled to the inductor 104 by an inductor conductive layer, such as layer 104a, where the output layer 129 may be connected to any suitable load, such as to a capacitor or another type of suitable load, in some embodiments. The inductor 104 and the die 116 (such as die 116 of FIG. 1A, for example) comprise portions of a voltage regulator circuit, such as a FIVR circuit, in an embodiment.

Returning back to FIG. 1A, one or more thermal solution structures 108, which may comprise thermal mass and/or thermal heat sink structures 108, may be on a surface/first side 117 of the inductor 104. In an embodiment, the one or more thermal solutions may be directly on the surface 117 of the inductor, and may be directly mounted to the inductor 104 by a solder material 122 or by a thermally conductive epoxy material 122, in an embodiment. The one or more thermal solution structures 108 are thermally coupled to the inductor 104, and provide a thermal cooling for the inductor 104, thus preventing inductor damage by excessive current loads. In an embodiment, the one or more thermal solution structures 108 may provide a mechanism for thermal exchange from the inductor 104 to the ambient environment. For example, the one or more thermal solution structures 108 may direct heat away from the one or more inductors 104 towards a standoff region 137 between the substrate 102 and the board 110. In an embodiment, the one or more thermal solution structures 108 extend into a portion of the standoff region 137, and extend away from the second side 105 of the substrate 102 (they are not coplanar with the second side 105 of the substrate 102). The heat carried through the standoff region 137 may exit the package substrate 100, into the ambient environment. In an embodiment, the thermal solution structures 108 comprise a length which is less than a length of the standoff region 137. In other words, the thermal solution structures 108 do not make physical contact with the first side 109 of the board 110, in an embodiment. The thermal solution structures 108 possess the capability of being able to draw heat away from the one or more inductors 104, and direct the heat to the ambient environment, thus cooling the inductor 104, and allowing the die 116 to operate at higher current levels and/or for longer periods of time. In some embodiments, fans, such as computer fans, may be coupled to the package to facilitate the escape of heat from the inductor to the ambient environment.

The thermal solution structures 108 extend the thermal time constant of the inductor, thus allowing longer bursts of high current through the inductor 104. The thermal solutions structures 108 increase the amount of time it takes to for the inductor 104 to increase its temperature. By increasing the self-heating time constant of the inductor 104, longer (or larger amplitude) burst of increased amounts of current can be allowed to flow through the inductor 104, while maintaining the inductor 104 temperature below a maximum limit. Thus, the thermal solution structures 108 described in the embodiments of the present disclosure enable a processor die to remain in a turbo boost mode for longer periods of time, as compared with package structures not utilizing the thermal solution structures as described herein.

In an embodiment, the one or more thermal solution structures 108 may be mounted onto the surface 117 of the inductor 104 utilizing surface mount technology (SMT) techniques, such as by utilizing a solder material to mount the one or more thermal solution structures 108 to the surface 117 of the inductor 104. In an embodiment, the thermal solution structures 108 do not electrically alter the performance of the inductor 104. In an embodiment, the thermal solution structures 108 may act as an additional thermal capacitance. In an embodiment, the solder interconnect structures 120 may be adjacent to the thermal solution structures 108 on the second surface of the substrate 102. In an embodiment, the discrete components 112 which may comprise die side capacitors, in an embodiment, may be adjacent to the thermal solution structures 108 on the second side 105 of the substrate 102.

By providing cooling to the inductor 104, the inductor can be used with larger currents, allowing more power to be delivered to the die 116 (which may comprise one or more processors). Higher operational current levels enable a processor, such as a CPU of a microelectronic device, to increase performance. The total current that may be passed through an inductor, as described herein, is thus increased by the implementation of the thermal solution structures, and the inductor is protected from being damaged by excessive heat.

The embodiments described herein allow the CPU of a device to avoid throttling back by reducing current demand, and/or to avoid limiting the time the CPU is in a high current state. Both of these conditions, throttling back or limiting time, lead to product performance reductions because the CPU is capping its current or time in a turbo mode, for example, in order to accommodate the inductor current limits. The various embodiments included herein enable the inductor temperature to be maintained at acceptable levels during peak current demand.

Figure 1E:
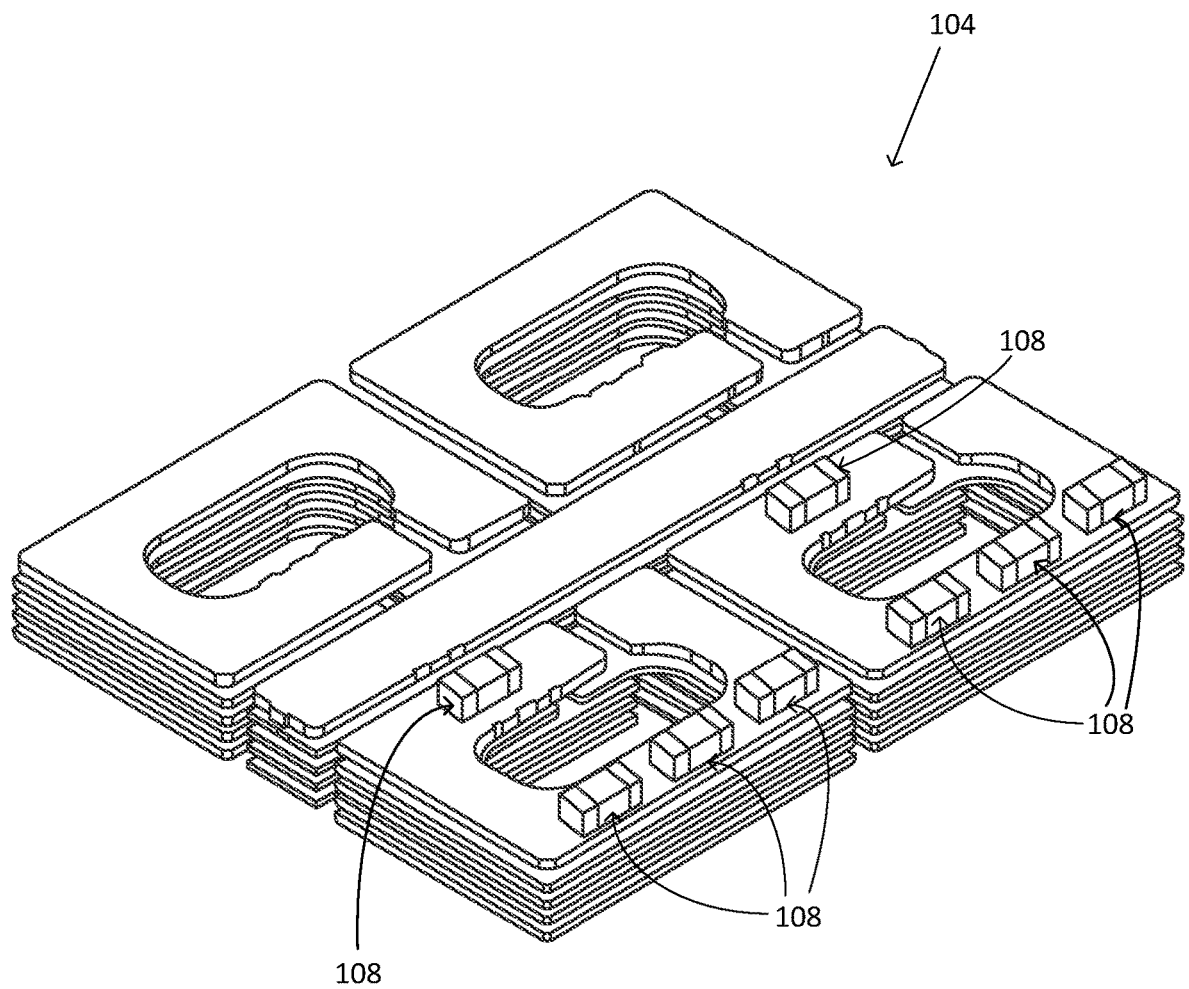
FIG. 1E illustrates a side perspective view of thermal mass structures, according to embodiments.

FIG. 1E depicts a side perspective view of thermal solution structures 108 on a surface of the inductor 104. In an embodiment, the thermal solutions 108 may comprise thermal mass structures 108 that may be solder mounted onto the surface of the inductor 104. In other embodiments, the thermal mass structures 108 may be mounted onto the surface of the inductor 104 by using thermally conductive epoxy materials. In an embodiment, the thermal mass structures 108 may comprise materials that possess high volumetric heat capacity. In an embodiment, the thermal mass structures 108 may comprise such materials as steel, iron, copper, aluminum, glass or similar materials. In an embodiment, the thermal mass structures 108 may comprise materials that possess volumetric heat capacities that are greater than the volumetric heat capacity of air (0.001 J/cm$^3$K). In an embodiment, any number of thermal mass structures 108 may be placed on the surface of the inductor 104, where the locations of the thermal mass structures 108 may be varied depending on a particular application.

Figure 1F:
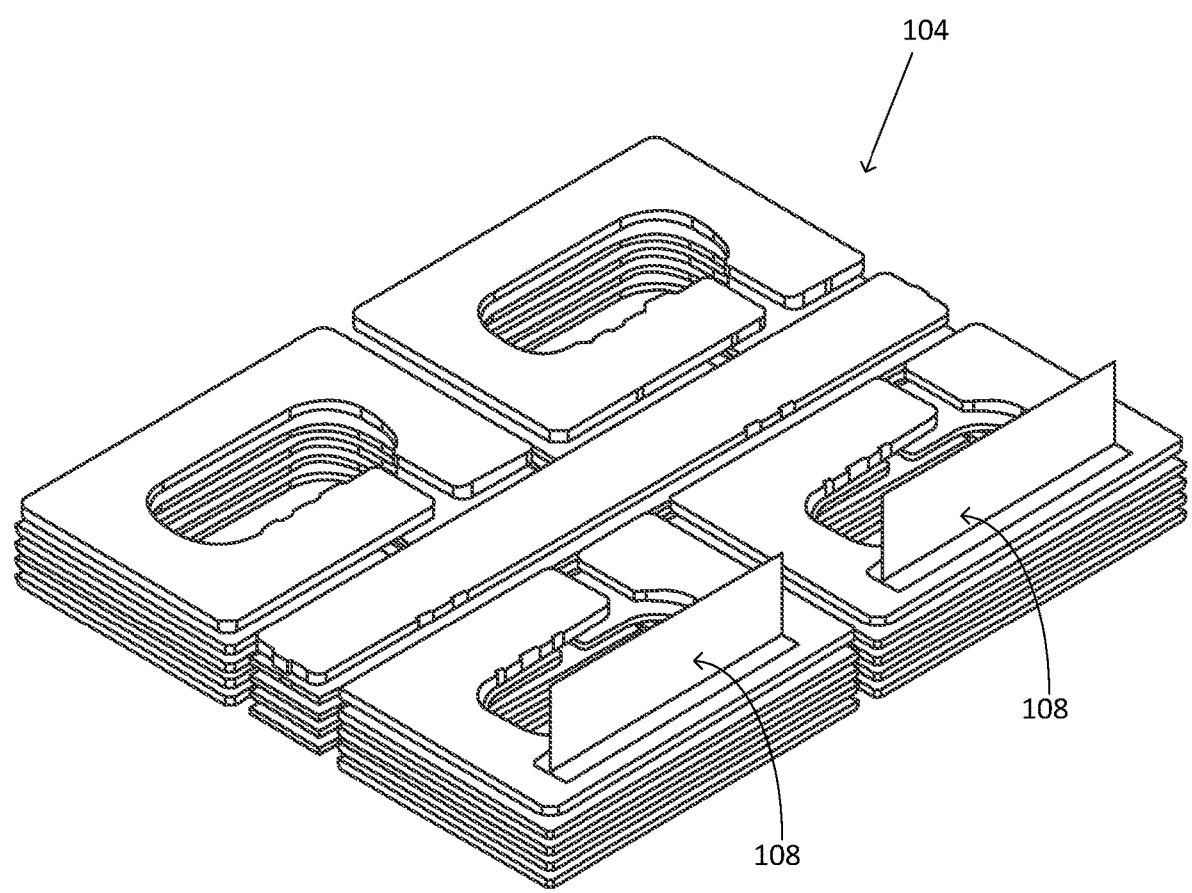
FIG. 1F illustrates a side perspective view of heat sink structures, according to embodiments.

FIG. 1F depicts a side perspective view of thermal solutions 108, where the thermal solutions 108 comprise one or more heatsink structures. In an embodiment, the heatsink structures 108 may comprise such materials as copper and/or aluminum, and other such materials that are both electrically and thermally conductive. In some other embodiments, the heatsink structure 108 materials may comprise materials that are thermally conductive, but are electrical insulators, such as, but not limited to, aluminum, for example. In an embodiment, the heatsink structures 108 may be attached to the surface of the inductor 104 by using electrically conductive methods and/or materials, such as solder for example. In other embodiments the heatsink structures 108 may be attached the surface of the inductor 104 by using electrically insulating methods and/or materials, such as by using thermally conductive epoxy, for example.

Figure 1G:
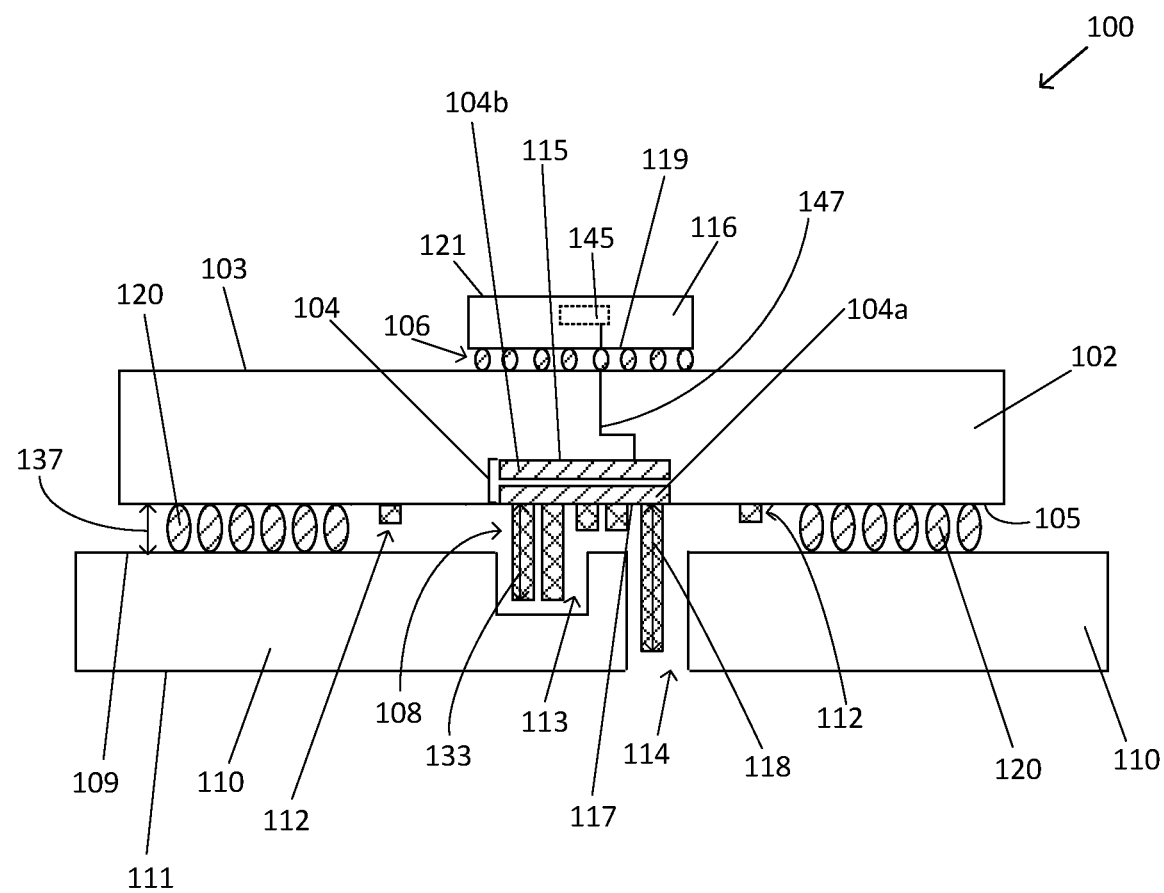
FIG. 1G illustrates a cross-sectional view of a package structure having thermal solution structures, according to embodiments.

FIG. 1G depicts another embodiment of a package structure 100, where at least one of the thermal solution structures 108 comprise a length which is greater than the standoff length 137. In an embodiment a length of at least one of the one or more thermal solution structures 108 may extend within at least one of a cavity 113 within the board 110, or may extend at least partially within an opening 114 within the board 110. Within a cavity 113, where the cavity extends partially through the board 110. In an embodiment, the cavity 113 extends partially within the board 110, and may comprise any suitable length, but does not extend completely through the board 110.

For example, one or more of the thermal solution structures 108 may be a lease partially within the cavity 113, and may comprise a length 133, which is greater than the standoff 137 length. In another embodiment the opening 114 extends completely through the board 110. At least one of the one or more thermal solution structures 108 may extend at least partially within the opening 114. For example, at least one of the one or more thermal solution structures 108 may extend at least partially within the opening 114, and may comprise a length 118, that is greater than a length of the stand-off 137 region. Any number of thermal solution structures 108 may be within at least one of the cavity 113 or the opening 114 of the board 110, and any number of cavities 113 or openings 114 may be located within or through the board 110. The cavity 113 and the board 114 are located between the discrete components 112, and/or within the footprint of the inductor 104.

Figure 1H:
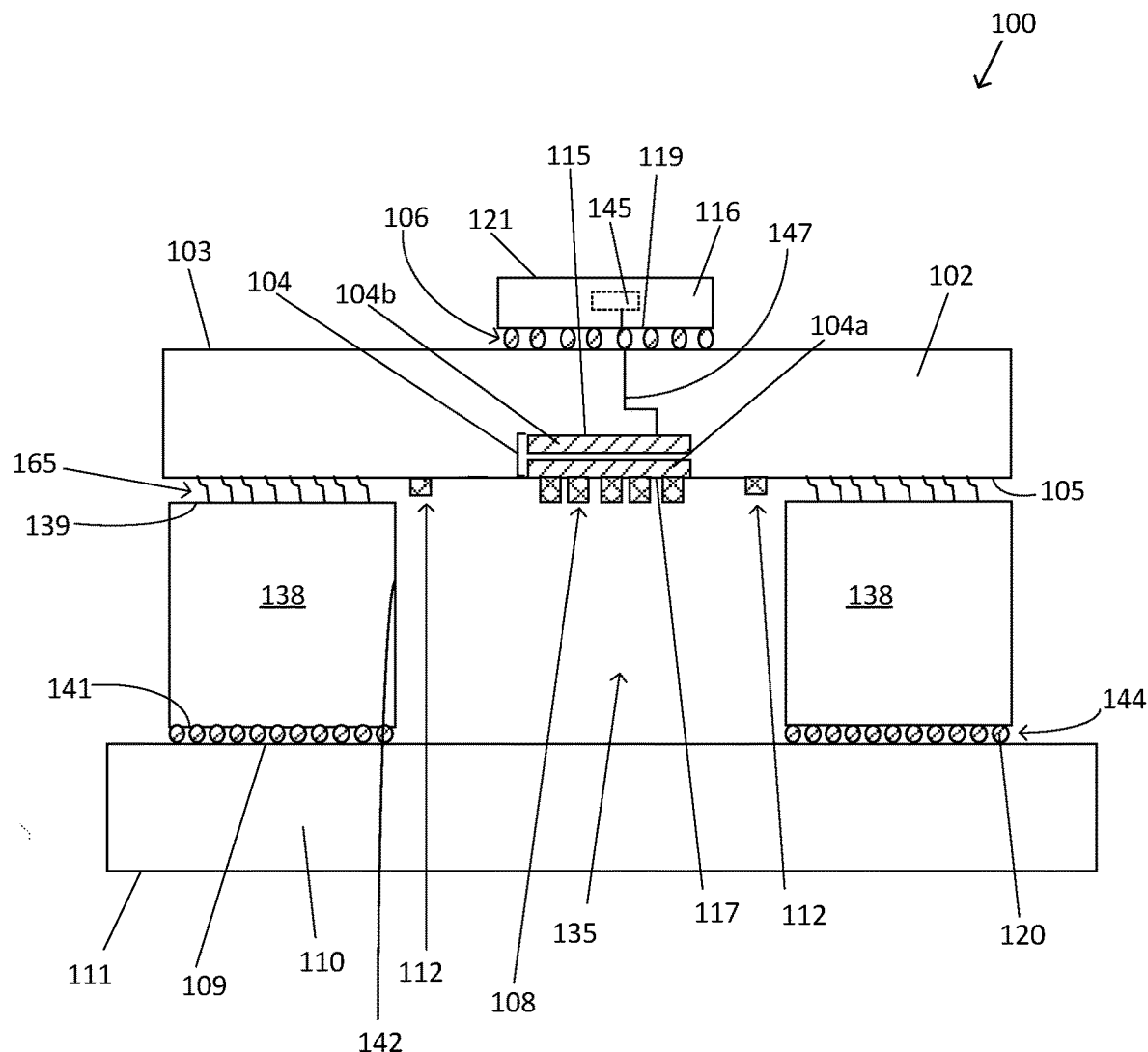
FIG. 1H illustrates a cross-sectional view of a package structure having thermal solution structures, according to embodiments.

FIG. 1H depicts another embodiment of a package structure 100 comprising thermal solution structures 108, where a socket 138 is between the second surface 105 of the substrate 102 and a first surface 109 of the board 110. The socket 138 may comprise an opening 135, such as a cavity 135, which may comprise an opening in the socket 138. In an embodiment, the cavity 135 may comprise a recess 135, wherein the recess 135 does not extend completely through the socket 138 length. The socket 138 may be attached between the board 110 and the substrate 102 by utilizing pins 165, in an embodiment. In other embodiments, the socket 138 may be attached between the second side 105 of the substrate 102 and the first side 109 of the board 110 by any suitable attachment means. In an embodiment, the socket 138 may comprise a pin grid array socket, but in other embodiments the socket 138 may comprise any other suitable type of socket, such as but not limited to a land grid array socket, for example. In an embodiment the socket 138 may comprise a first side 139 and a second side 141, where a plurality of interconnect structures 144, such as solder interconnect structures 144, may be between the second side 141 of the socket 138 and the first side 109 of the board 110.

In an embodiment, the thermal solution structures 108 and the discrete components 112 may extend at least partially within the socket opening 135. In other embodiments, the thermal solution structures 108 and the discrete components 112 may not extend into the socket opening 135. In an embodiment, the discrete components 112 may be adjacent a sidewall of the socket opening 135. The one or more thermal solution structures 108 may carry heat transferred from the inductor 104 to the ambient environment.

The thermal solution structures 108 provided herein enhance thermal dissipation within the package substrate 102, and for the package structures 100 in general. The embodiments herein provide additional thermal dissipation for a CPU, as well as providing for a reduction of DC resistance of the inductor, thus improving the performance of the CPU. In an embodiment, the inductor structures 104 coupled to the thermal solution structures are capable of carrying increased current, and allow for increased current levels to be delivered to the CPU, which in turn increases CPU performance. The embodiments herein include mounting thermal solution structures, which may comprise any suitable shape, size or number, onto the surface of the inductor. The thermal solution structures provided herein are able to provide cooling of the inductor in order to draw the heat away from the inductor, thus reducing the overall inductor temperature and increasing the inductor current capacity.

Figure 2:
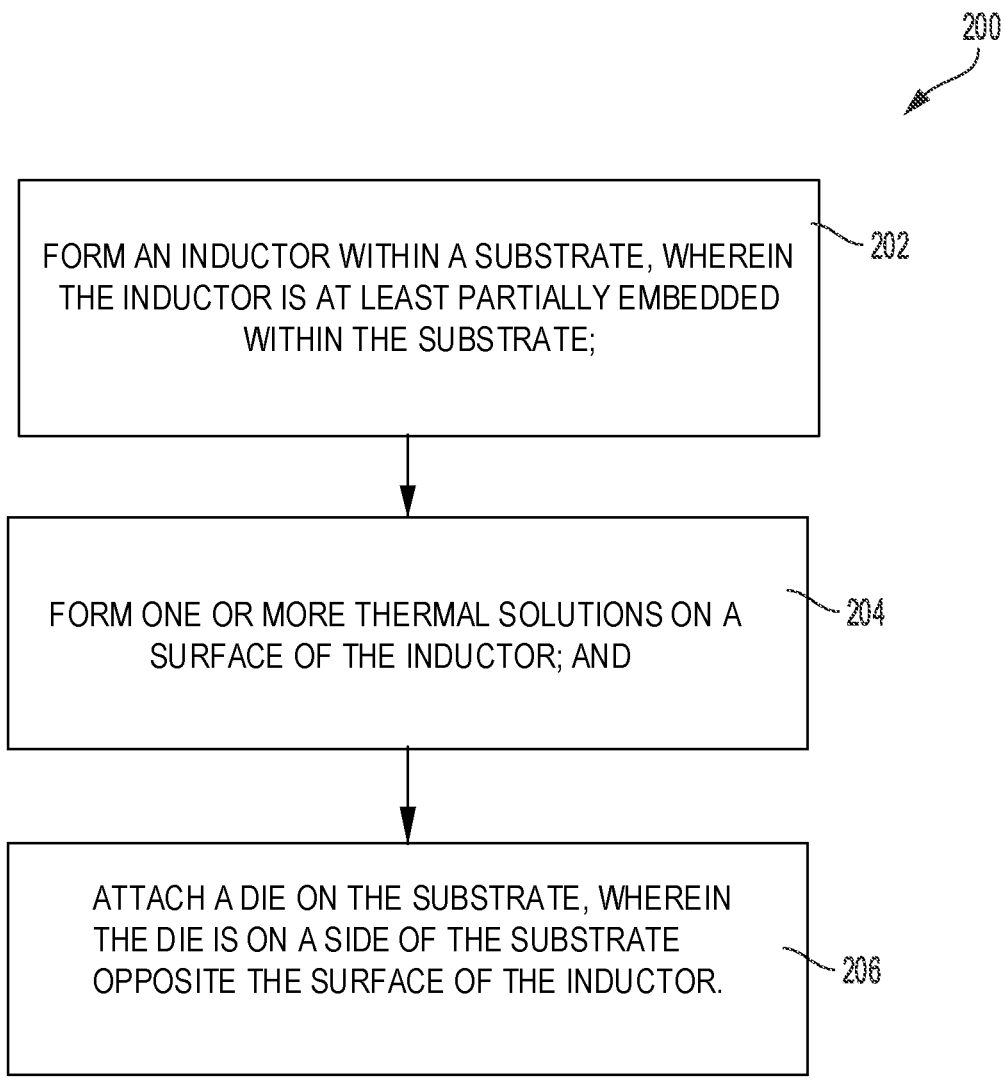
FIG. 2 is a flow diagram illustrating a method of fabricating package structures having thermal solution structures, according to embodiments.

FIG. 2 depicts a flow chart of an embodiment of a method 200 of forming thermal solution structures on a surface of one or more inductors, where the one or inductors are at least partially embedded within a first side of a substrate. The substrate further comprises a die attached to a second side of the substrate, opposite the first side of the substrate, where the die includes voltage regulator circuitry. The inductor is coupled with the voltage regulator circuitry of the die by electrical traces/signals that are within the substrate and coupled to die interconnect structures that are between an active surface of the die and the substrate. The thermal solution structures described herein enable the cooling of the inductor. The method 200 may share any or all characteristics with any other methods discussed herein, such as, but not limited to, the methods disclosed in FIGS. 3A-3K. For example, FIGS. 3A-3K may show cross-sectional views of structures employing any of the operations described in method 200. It should be noted that the order of the operations of method 200 may be varied, according to a particular application.

At operation 202, an inductor is formed within a substrate, where the inductor is at least partially embedded within the substrate. The substrate may comprise a first side and a second side. A recess may be formed in the second side of the substrate. The recess may be formed by utilizing a dielectric etch, where a portion of the package substrate may be removed to accommodate the dimensions of the inductor. Any suitable removal process may be used to form the recess, such as an etching process, for example. An inductor may be formed within the recess of the second side of the substrate. The inductor may comprise any number of conductive windings/layers, in an embodiment.

In an embodiment, the conductive windings/layers of the inductor may be formed to comprise any number of conductive layers, where the layers of conductive material may be formed within the recess. The conductive layers of the inductor may be formed utilizing such processes as plating process, and/or physical vapor deposition processes, for example. The conductive material, such as copper for example, may be patterned and etched using any suitable lithographic techniques, including such techniques as laser etching or drilling processes, for example, to form the inductor conductive layers.

Conductive via structures may be formed between each successive conductive layer, and may electrically and physically couple each inductor layer with each other. The conductive via structures may be formed of any suitable conductive material, such as copper, for example, and may be formed utilizing any suitable known patterning and etching techniques, such as, but not limited to, photolithographic methods, for example. A first surface of the inductor is formed such that it is substantially coplanar with the second side of the substrate, in an embodiment. In other embodiments, the first surface of the inductor may comprise a solder resist material on the first surface, which may be separate subsequently patterned and etched to form electrical and thermal contacts to the inductor. In an embodiment, the one or more inductors are formed to be at least partially thermally exposed to a standoff region between the substrate and the board, such that a first layer of the inductor is exposed and partially external to the package substrate.

A second surface of the inductor is at least partially embedded within the package substrate material. The conductive layers of the inductor may comprise a conductive material such as a metal, and may include copper, aluminum or gold, for example, and may be in the shape of pillars or lands, in some cases. At least one discrete component such as a die side capacitor, or a resistor for example, may be formed adjacent to the inductor, and may be formed on the second side of the substrate. A plurality of interconnect features may be formed adjacent to the discrete component, on the second surface of the substrate. The plurality of interconnect features may comprise conductive bumps, such as C4 bumps or balls, or wire structures, in some embodiments. The plurality of interconnect features may be formed in any variety of manners, such as, but not limited to plating processes, printing and reflow processes or wire bonding, for example.

The inductor may be an ACI inductor in an embodiment, and in other embodiments, the inductor may comprise any suitable type of inductor for a particular application. Conductive traces may be formed within the package substrate with which to couple the inductor to the die. In some embodiments, more than one die may be attached to the first side of the substrate. The conductive traces may couple the inductor to portions of a voltage regulator circuitry that may reside within the die. The inductor may comprise a portion of the voltage regulator circuitry. The inductor may comprise a portion of a FIVR circuitry in an embodiment. In other embodiments, the inductor may comprise any other type of suitable circuitry with which to regulate voltage within a microelectronic device incorporating the package structures described herein.

At operation 204, one or more thermal solution structures may be formed/placed on a surface of the inductor. In an embodiment, the thermal solution structures may comprise at least one of the heat sink or thermal mass. In other embodiments, the thermal solution structures may comprise any suitable thermal solution which may enable the cooling of the one or more inductors, and may enhance thermal time constant of the inductor. In an embodiment, the thermal solution structures may initially be placed in a pick and place tray. Solder paste may be applied on the second side of the substrate through a stencil four patterning purposes, for example. The thermal solution structures may then be placed on desired locations of the surface of the inductor. Discrete components may then be optionally placed on the second side of the substrate, adjacent to the thermal solution structures. Interconnect structures, such as solder interconnect structures may be placed on the second side of the substrate and peripheral regions, adjacent to the discrete components. The substrate may then be placed in a reflow oven to form a solder mount/connection between the thermal solution structures and the surface of the inductor.

In another embodiment, the thermal solution structures may be initially placed in a pick and place tray. An epoxy material may be applied and/or dispensed onto the inductor surface. The thermal solution structures may then be placed on the inductor surface. Discrete components may be optionally placed on the second side of the substrate, adjacent to the thermal solution structures. In an embodiment, interconnect structures, which may comprise a plurality of solder balls, may be formed on peripheral regions of the second side of the substrate, adjacent to the discrete components. The substrate may then be placed in a cure oven to form an epoxy mount/connection between the thermal solution structures and the surface of the inductor.

At operation 206, a die, such as a processor die, may be attached (either initially or subsequently) to the first side of the substrate, opposite the second side of the substrate. The die may include any type of die, such as a processor die, or a memory die, for example, and may comprise voltage regulator circuitry. The die may comprise a first side and an opposing second side, where the second side of the die may be attached to the first side of the substrate, opposite the inductor. Optionally, the die may be attached subsequent to the attachment of the board to the substrate, or may be attached prior to the attachment of the substrate to the board. The die may be attached using known die attach processes.

The attached die may have a plurality of interconnect features, such as a plurality of solder balls, on the second side of the die, which may be an active side of the die, in some embodiments. The plurality of interconnect features may comprise metal, such as copper, aluminum or gold, for example, and may be in the shape of pillars or lands, in some cases. The plurality of interconnect features may be conductive bumps, such as C4 bumps or balls, or wire structures, in some embodiments. The plurality of interconnect features may be formed in any variety of manners, such as, but not limited to plating processes, printing and reflow processes or wire bonding, for example. The substrate comprising the thermal solution structures on the surface of the inductor may be physically attached to a board.

Figure 3A:
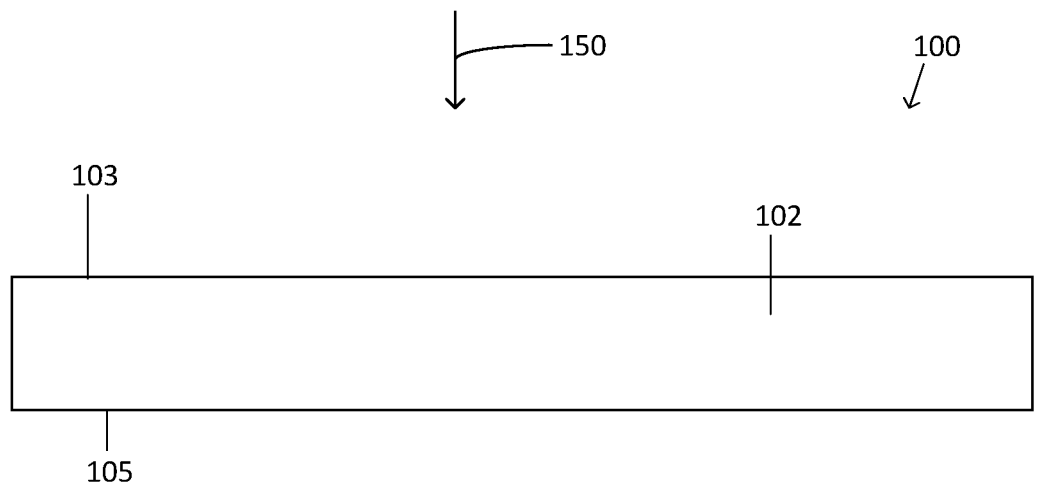
FIGS. 3A-3K illustrate cross-sectional views of package structures formed according to methods of fabricating package structures having thermal solution structures, according to embodiments.

FIGS. 3A-3K depict cross-sectional views of structures formed by employing a process of fabricating package device structures comprising one or more thermal solution structures on a surface of an inductor, where the inductor is at least partially embedded within a substrate. The thermal solution structures provide cooling for the inductor, which enables higher current operation for a die/processor attached to the package structure. In FIG. 3A, a portion of a substrate is depicted. In an embodiment the substrate 102 may comprise a first side 103 and a second side 105. The substrate 102 may comprise a package substrate, in an embodiment. The substrate 102 may comprise a dielectric material with any number of conductive circuitry traces embedded therein. A recess (not shown) may be formed, utilizing any suitable recess formation process 150, such as an etching process, and/or a drilling process, for example. The recess may be formed on the second side 105 of the substrate 102.

Figure 3B:
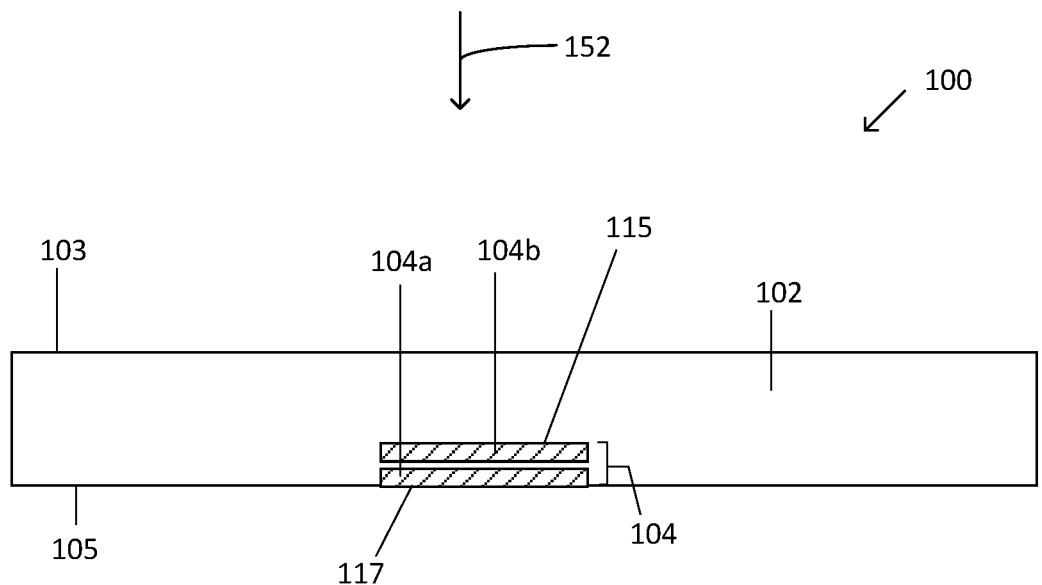

In FIG. 3B, an inductor 104, may be formed, utilizing an inductor formation process 152, at least partially within the substrate 102. A surface/first side 117 of the inductor 104 may be at least partially exposed to the ambient environment, or may be subsequently thermally exposed to the ambient environment by creating thermal contacts to the surface 117 of the inductor 104. In an embodiment, the inductor 104 may be substantially coplanar with the second side 105 of the substrate. A second side 115 of the inductor 104 may be at least partially embedded within the substrate 102. In an embodiment, the inductor 104 comprises a first conductive layer 104a and a second conductive layer 104b. The conductive layers 104a, 104b of the inductor 104 may be formed by physical deposition and/or any suitable plating process, such as an electroplating process for example. The first conductive layer 104a may comprise a thickness and a width (such as the thickness and width depicted in FIG. 1B for example), which may vary according to the particular application. The second conductive layer 104b may comprise a thickness and a width that is the same thickness and width as the first conductive layer 104a of the inductor 104. In other embodiments, the first and second layers 104a, 104b may not be equal in thickness and width. In other embodiments, the inductor 104 may comprise any number of conductive layers.

Via structures (not shown), such as those depicted in FIG. 1B, for example, may physically and electrically couple the conductive layers 104a, 104b to each other. In an embodiment the inductor 104 may comprise an ACI inductor, and may be included within a portion of a voltage regulator circuitry, which is electrically coupled through traces (not shown) located within the package substrate 102 to voltage regulator circuitry that is located within a die (not shown) that may be subsequently attached to the first side 103 of the substrate 102. The inductor 104 may be within the footprint of a die, such as the die in FIG. 1A, for example.

Figure 3C:
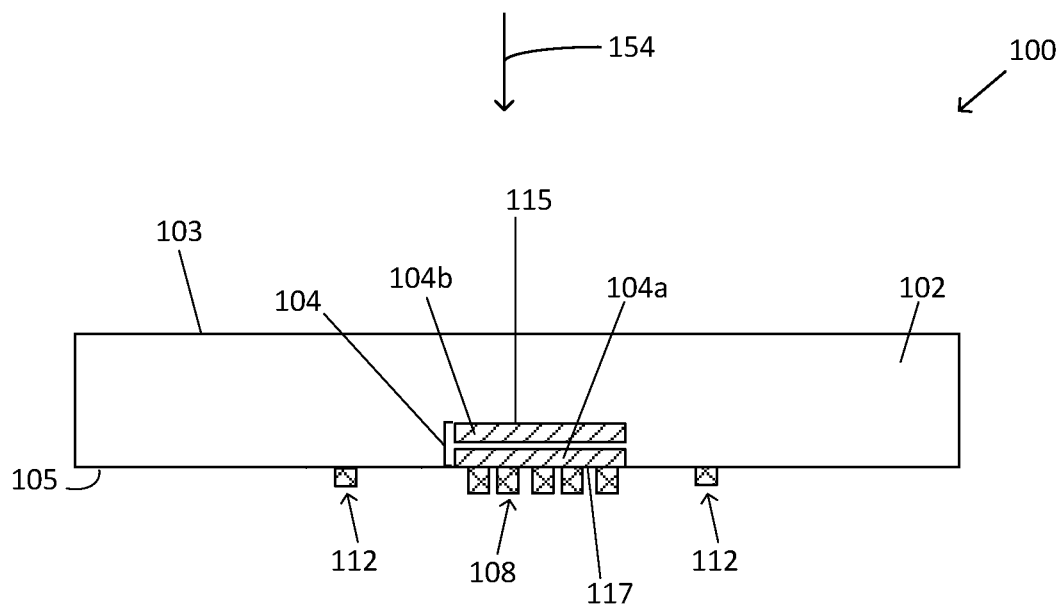

In FIG. 3C, one or more thermal solution structures 108 may be placed on the surface 117 of the inductor 104 utilizing a thermal solution structure formation process 154.

The number and location of the one or more thermal solution structures 108 may be optimized in order to meet particular device requirements for the inductor 104 time constant parameters. Any number of discrete components, such as, but not limited to, die side capacitors, may be placed on the second side 105 of the substrate 102, adjacent to the one or more thermal solution structures.

Figure 3D:
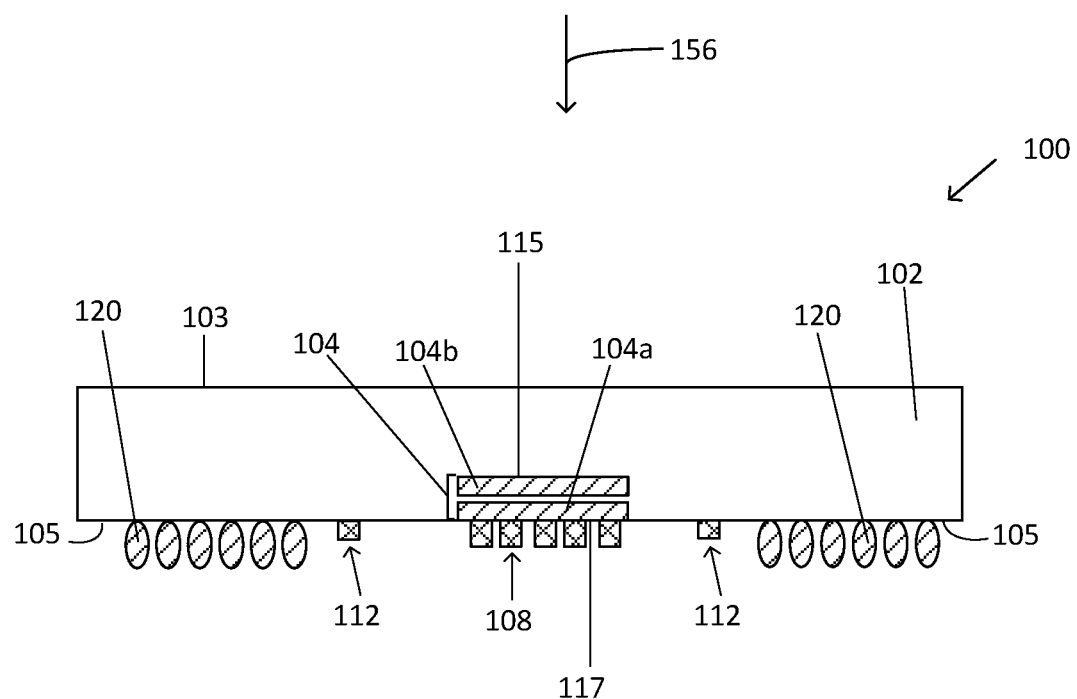

In FIG. 3D, a plurality of interconnect structures 120 may be placed on the second side 105 of the substrate 102, adjacent to the one or more discrete components. In an embodiment, the plurality of interconnect structures 120 may comprise an array of solder balls, such as an array of ball grid array (BGA) solder balls. The interconnect structures 120 may be attached to the second side 105 of the substrate 102 by utilizing a solder reflow process, or may be formed by any other suitable interconnect structure formation process 156, for example.

Figure 3E:
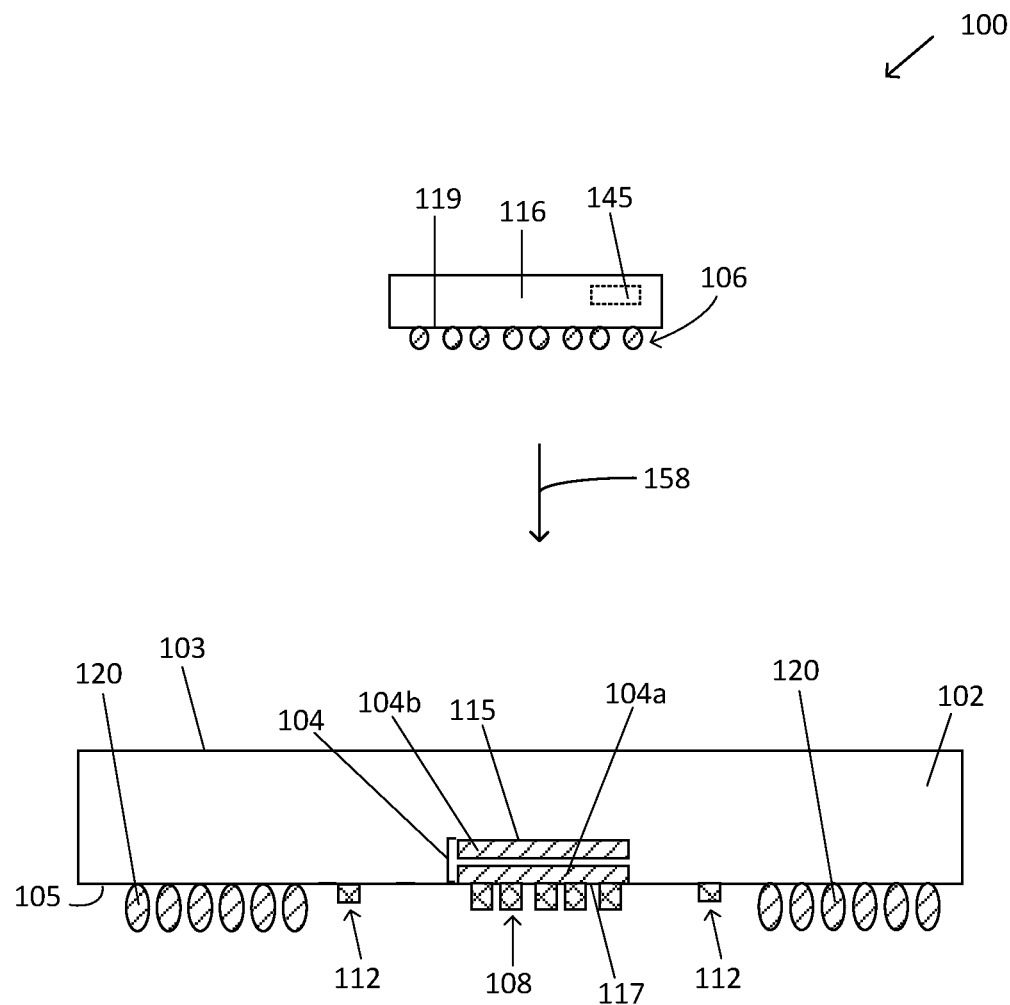

In FIG. 3E, a die 116 may be attached to the first side 103 of the substrate 102 by utilizing any appropriate die attach process 158. The die 116 may comprise a portion of a voltage regulator circuitry 145, which may be electrically coupled to the inductor 104 by a signal trace (such as the signal trace 147 of FIG. 1A, for example). The die 116 may comprise various types of materials, such as conductive, dielectric and semiconductor materials. The die 116 may include any number of circuit elements, such as any type of transistor elements and/or passive elements. The individual die 116 may comprise n-type and/or p-type transistors, which may include materials such as silicon, germanium, indium, antimonide, lead telluride, indium arsenide, indium phosphide, gallium arsenide, or gallium antimonide, for example. The individual die 116 may include such structures as planar transistors and/or nonplanar transistors, such as FinFET transistors, nanowire transistors or nanoribbon transistors.

The die 116 may be attached to the substrate 102 by using any suitable attachment process 158, where the plurality of interconnect features 106 on the first side 119 of the die 116, may be joined to interconnect features/pads (not shown) that are on the first side 103 of the substrate 102. Active surfaces of the die 116 may be attached to the first side 103 of the substrate 102, wherein conductive contacts of various integrated circuit devices, such as transistor devices, for example, may be available for connection to the package substrate 102.

The die 116 may comprise an array of interconnect structures 106 on the first side 119 of the die 116. The interconnect structures 106 may be formed by using solder materials, such as tin, silver, gold, nickel, for example in an embodiment. Other conductive materials may be used to form the interconnect structures. The interconnect structures 106 may comprise any shape, such as a spherical shape or a rectangular shape, for example. The interconnect structures 106 may be formed using metallization processing such as physical vapor deposition or plating processing. In an embodiment, the die 116 may be coupled to the first side 103 of the substrate 102, wherein the interconnect structures 106 are between the first side of the die 119 and the first side 103 of the substrate 102 and may be placed on conductive pads (not shown) that are mirrored on the first side 103 of the substrate 102. In other embodiments, the die 116 may be attached subsequent to the substrate 102 attachment to a board, such as the board 110 depicted in FIG. 1A for example.

Figure 3F:
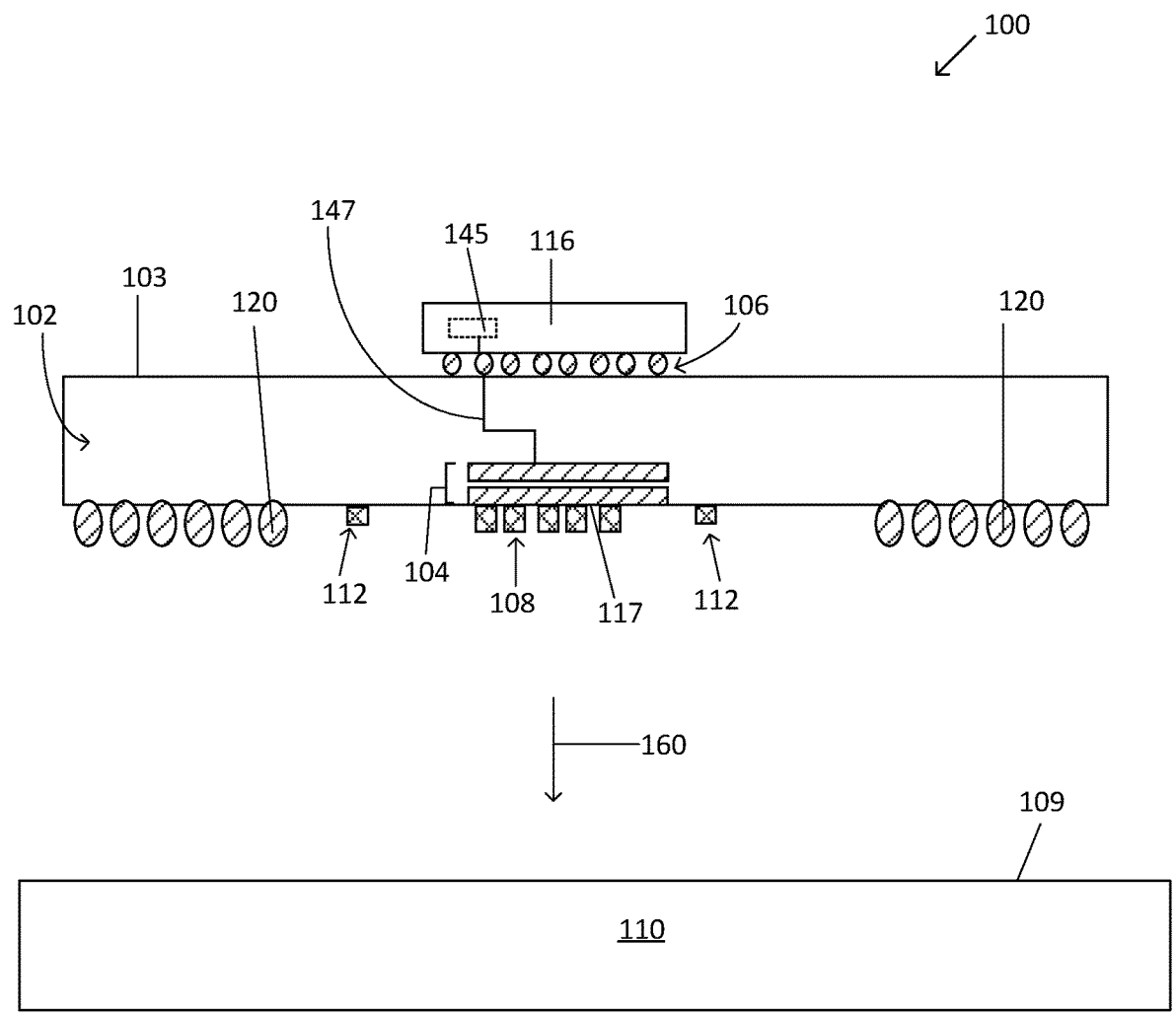

In FIG. 3F, a board 110 is provided, where the board 110 may comprise a motherboard or a printed circuit board, for example. The board 110 may be any suitable substrate with which to attach the package substrate 102 thereto, as needed for a particular design requirement. An attachment process 160 may be utilized to attach the first side 109 of the board 110 to the second side 105 of the substrate 102. Any appropriate substrate attachment process 160 may be utilized, where the solder interconnect structures 120 may be attached by a reflow process, for example to pads (not shown) on the first surface 109 of the board 110. The inductor 104 may comprise a surface 117 that is exposed, or at least partially exposed, to the ambient environment, where the surface 117 is between the second side 105 of the substrate 102 and the first side 109 of the board 110 in a standoff region, which may be between the second surface 105 of the substrate 102, and the first side 109 of the board 110, subsequent to attachment of the board 110 to the substrate 102 (such as the standoff region 137 depicted in FIG. 1A).

Figure 3G:
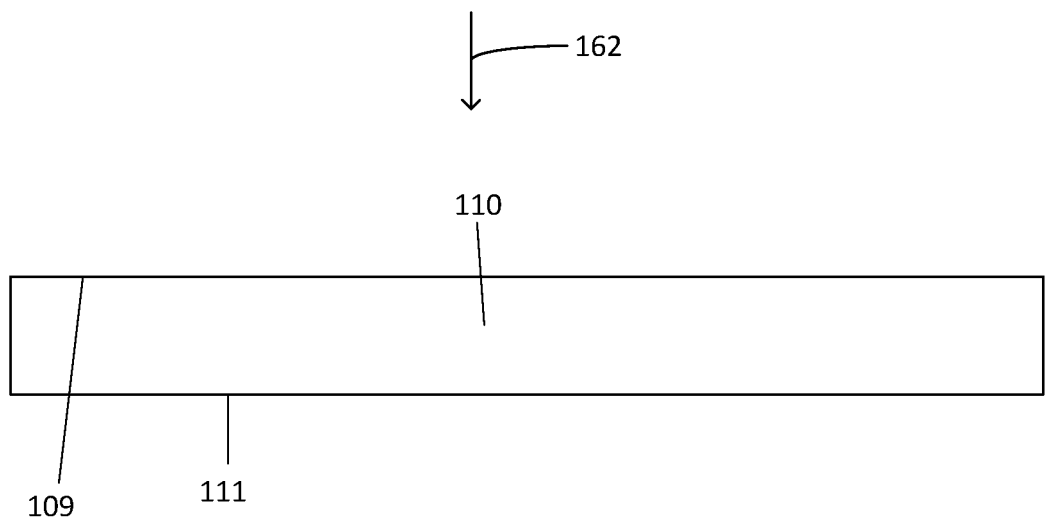
Figure 3H:
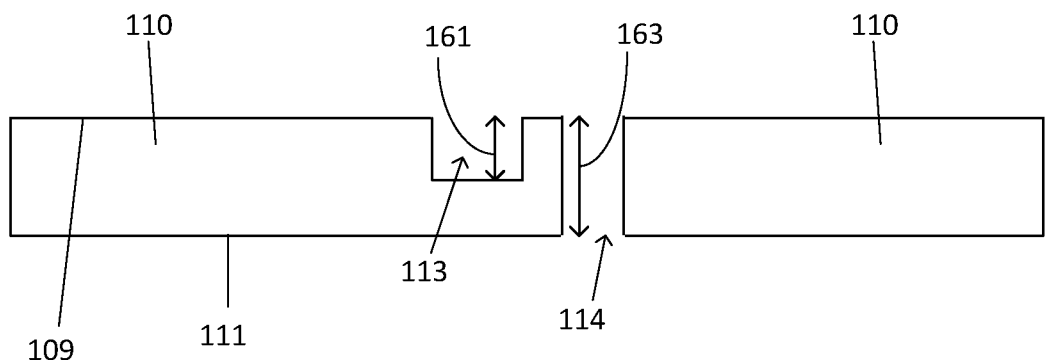

FIGS. 3G-3H depict an embodiment where a board 110 may be exposed to an opening formation process 162 (FIG. 3G). At least one of a cavity 113 or an opening 114 may be formed, at least partially, through the board 110 (FIG. 3H). In an embodiment, the cavity 113 may comprise a depth 161 which may be tailored to a desired length of the thermal mass which may be subsequently placed, at least partially, within the cavity 113. In an embodiment, the opening 114, which may comprise a board opening 114, may be formed completely through a thickness/depth 163 of the board 110. The at least one of a cavity 113 or an opening 114 may be formed within the footprint of the inductor.

Figure 3I:
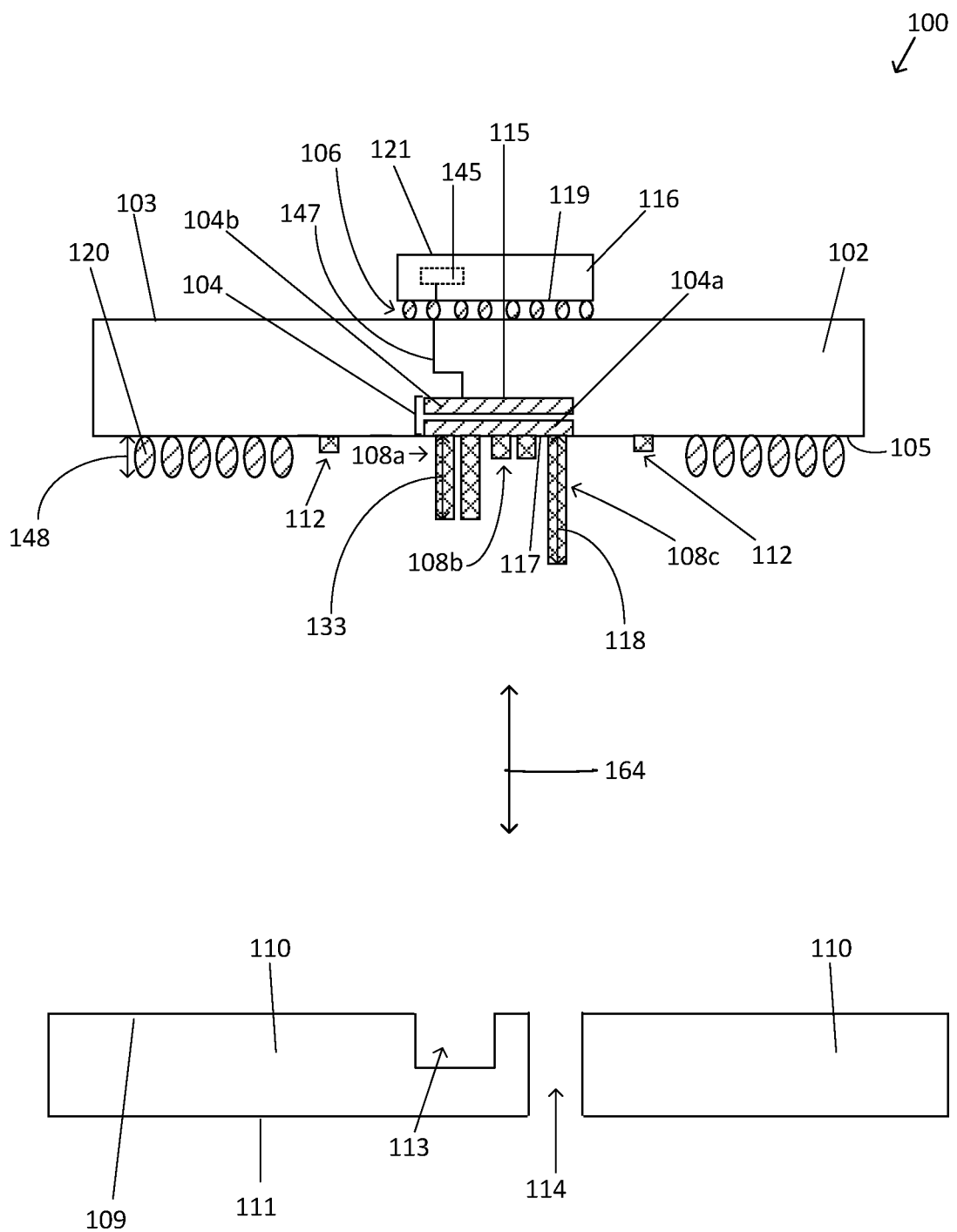

In an embodiment, a substrate 102 comprises thermal solution structures 108a, 108b, where the thermal solution structures 108a comprise a first length 133, the thermal solution structures 108 comprise a second length, where the second length is no greater than the height of the solder interconnect structures 120 (FIG. 3I). Thermal solution structures 108c may comprise a third length 118. The first length 113 and the third length 118 of the thermal solution structures 108a, 108c respectively, may be greater than the height 148 of the interconnect structures 120. The substrate 102, comprising a die 116 electrically coupled to the inductor 104 (where signal trace 147 may electrically couple voltage regulator circuitry 145 located within the die 116 to the inductor 104), may be attached to the board 110 utilizing an attachment process 164. In an embodiment, thermal solution structures 108a may be placed at least partially within a cavity 113 of the board 110. The thermal solution structures 108c may be placed at least partially within a board opening 114. The thermal solution structures 108 may extend partially within the standoff region between the substrate 102 and the board 110.

Figure 3J:
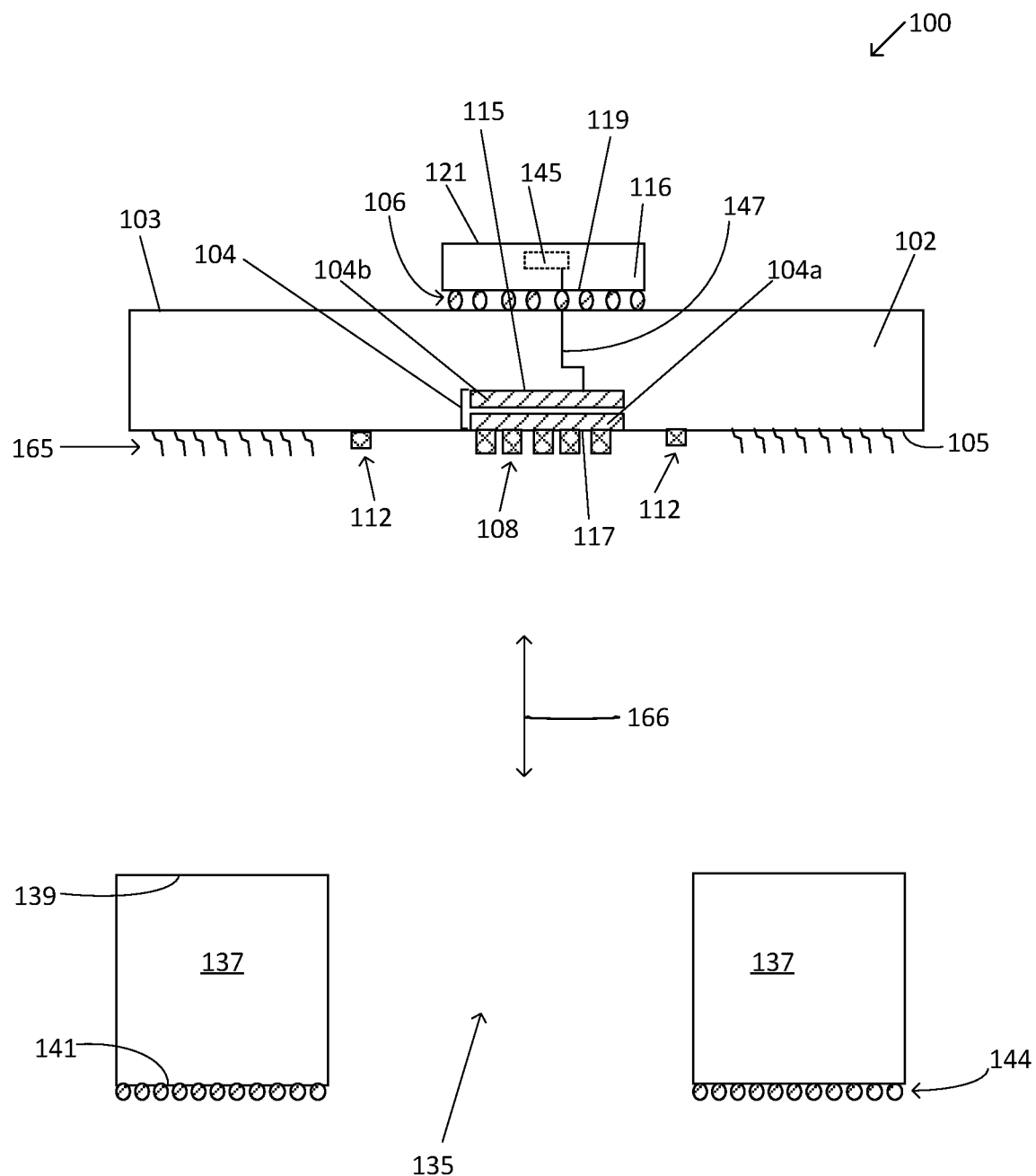

FIG. 3J depicts an embodiment where a substrate 102 comprising a die 116 electrically coupled to the inductor 104 (where signal trace 147 may electrically couple voltage regulator circuitry 145 located within the die 116 to the inductor 104) may be attached to a socket 138 having a cavity/socket opening 135. In an embodiment, the socket 138 may be attached to the second side 105 of the substrate 102 by utilizing a socket attachment process 166. In an embodiment, a plurality of pins 165 may couple the second side of the substrate 105 to a first side 139 of the socket 138. Any suitable coupling mechanism may be utilized to couple socket 135 to the substrate 102, in an embodiment. The one or more thermal solution structures 108, as well as the discrete components 112, may at least partially extend into the socket opening 135 subsequent to the attachment process 166. In an embodiment, a plurality of interconnect structures 144 may be disposed on the second side 141 of the socket 138.

Figure 3K:
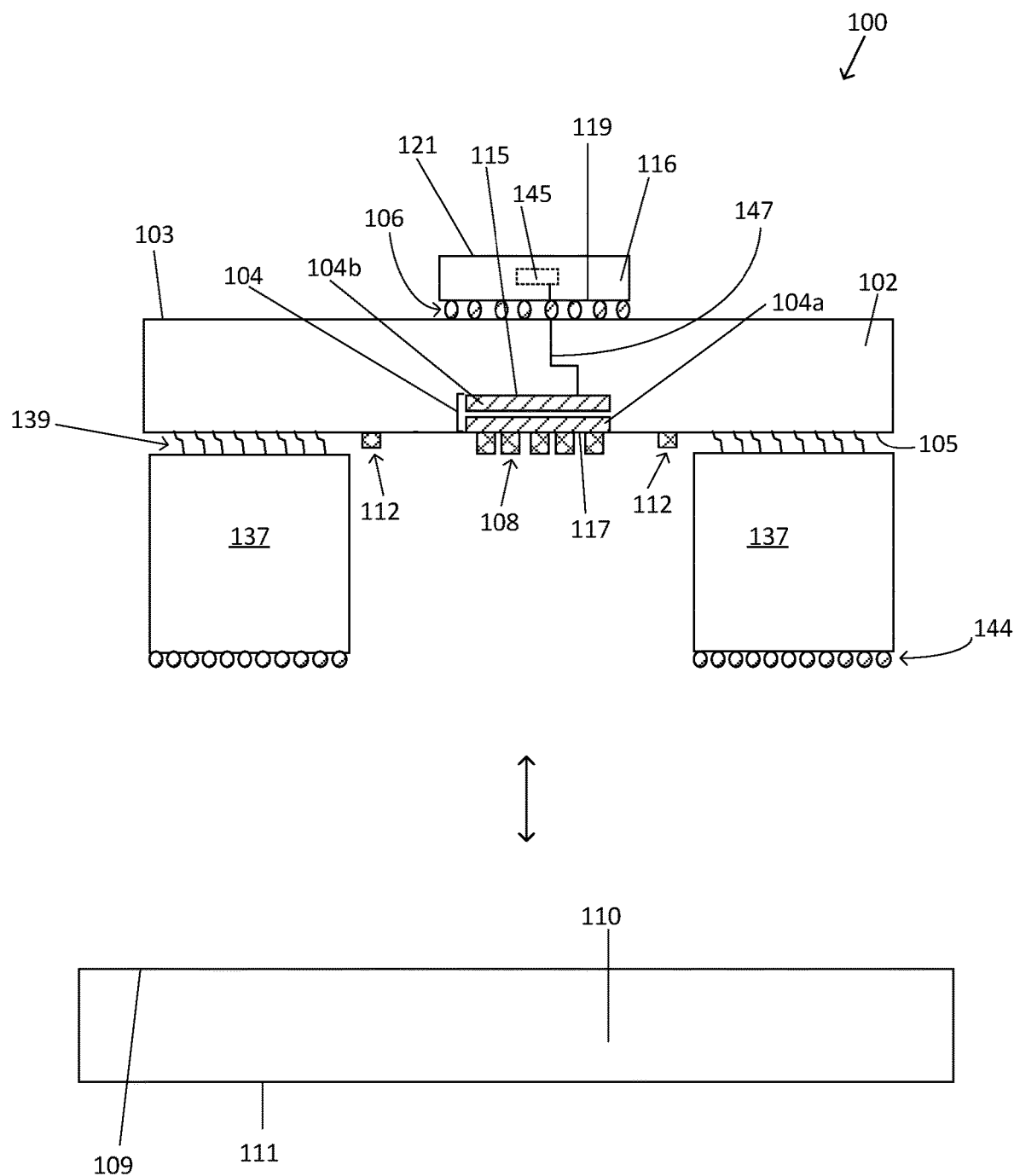

In FIG. 3K, the substrate 102 that is coupled to the socket 135 is attached to the board 110 by utilizing any suitable board attachment process 168. In an embodiment, the plurality of interconnect structures 144 may be coupled with the first side 109 of the board 110. Where the die 116 may comprise an integrated circuit die, in an embodiment.

Figure 4:
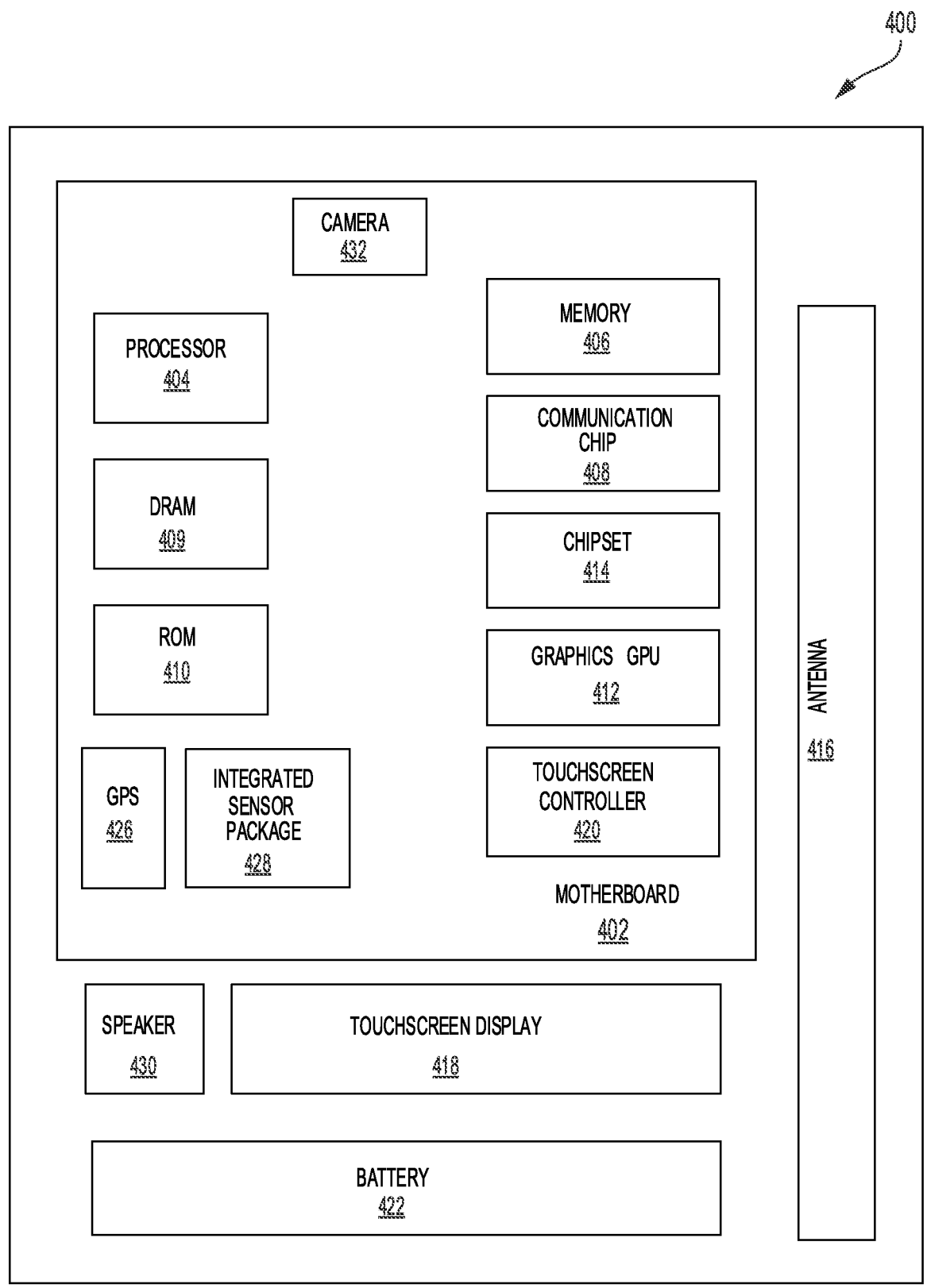
FIG. 4 is a functional block diagram of a computing device employing packaging structures having thermal solution structures, according to embodiments.

FIG. 4 is a schematic of a computing device 400 that may be implemented incorporating the package structures described in any of the embodiments herein comprising thermal solution structures that may provide thermal cooling for an inductor embedded within a package substrate, such as those depicted in FIG. 1A, for example. In an embodiment, the computing device 400 houses a board 402, such as a motherboard 402 for example. The board 402 may include a number of components, including but not limited to a processor 404, an on-die memory 406, and at least one communication chip 408. The processor 404 may be physically and electrically coupled to the board 402. In some implementations the at least one communication chip 408 may be physically and electrically coupled to the board 402. In further implementations, the communication chip 408 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 409, non-volatile memory (e.g., ROM) 410, flash memory (not shown), a graphics processor unit (GPU) 412, a chipset 414, an antenna 416, a display 418 such as a touchscreen display, a touchscreen controller 420, a battery 422, an audio codec (not shown), a video codec (not shown), a global positioning system (GPS) device 426, an integrated sensor 428, a speaker 430, a camera 432, an amplifier (not shown), compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments of the device structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments herein are not limited to the embodiments so described, but can be practiced with modification and alteration without departing from the scope of the appended claims.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the embodiments herein should, therefore, be determined with reference to the appended claims, along with the full scope of equivalents to which such claims are entitled.

What is claimed is:

1. A microelectronic package structure comprising:
   a substrate comprising a first side and a second side opposite the first side;
   a die on a first side of the substrate, the die comprising an integrated circuit;
   an inductor, wherein the inductor is at least partially embedded within the substrate; and
   one or more thermal solution structures on a surface of the inductor, where the one or more thermal solution structures are thermally coupled the inductor;
   a board electrically coupled to a second side of the substrate, and wherein a standoff region is between a surface of the board and the second side of the substrate, wherein the one or more thermal solution structures extend at least partially within the standoff region, wherein the board comprises at least one of a recess or an opening that extends through a length of the board, wherein at least one of the one or more of the thermal solution structures extend at least partially into one of the recess or the opening.

2. The microelectronic device package structure of claim 1, wherein the one or more thermal solutions comprise one or more thermal masses, wherein the one or more thermal masses comprise a volumetric heat capacity greater than air, and wherein the one or more thermal solution structures comprise an electrically insulating material or a thermally conductive material.

3. The microelectronic device package structure of claim 2, wherein the one or more thermal masses comprise one of a solder mount or an epoxy mount between the first side of the inductor and a surface of the one or more thermal masses, and wherein at least one capacitor is on the second side of the substrate, and is adjacent to the one or more thermal masses.

4. The microelectronic package structure of claim 1, wherein the inductor comprises a plurality of conductive layers, and wherein a first side of the inductor is substantially coplanar with a second side of the substrate.

5. The microelectronic package structure of claim 1, wherein the one or more thermal solution structures comprises a heat sink structure.

6. The microelectronic package structure of claim 5, wherein the heat sink structure comprises a material that is thermally conductive and electrically conductive, or comprises a material that is thermally conductive and is an electrical insulator.

7. The microelectronic package structure of claim 5, wherein a heat sink fin comprises one of a solder mount or an epoxy mount between the first side of the inductor and a surface of the one or more thermal masses.

8. An assembly comprising:
   a substrate comprising a first side and a second side;
   a die comprising an integrated circuit, wherein the die is on the first side of the substrate;
   a plurality of solder interconnect structures on the second side of the substrate, adjacent to the one or more discrete components;
   a board electrically coupled to the second side of the substrate;
   an inductor, wherein the inductor is at least partially embedded within the substrate;
   one or more thermal solution structures on a surface of the inductor and thermally coupled to the inductor, wherein the board comprises one of a cavity or an opening through the board, wherein at least one of the one or more thermal solution structures extends at least partially within one of the cavity or the opening, and wherein a different one of the one or more thermal solution structures comprises a length that is less than a length of a standoff region between the board and the substrate; and
   one or more discrete components on the second side of the substrate, adjacent to the one or more thermal solution structures.

9. The assembly of claim 8, wherein a socket is electrically coupled to the second side of the substrate, and is between the substrate and the board.

10. The assembly of claim 9, wherein the socket comprising a socket opening, wherein the one or more thermal solution structures extend at least partially into the socket opening.

11. The assembly of claim 8, wherein the die comprises a processor, wherein the processor includes voltage regulator circuitry, and wherein the inductor is electrically coupled to the voltage regulator circuitry.

12. The assembly of claim 8 wherein the one or more thermal solution structures comprises one or more of copper, aluminum, iron, steel, alumina or glass.

13. A method of fabricating a microelectronic package structure, comprising:

forming an inductor within a substrate, wherein a portion of the inductor is at least partially embedded within the substrate;

attaching one or more thermal solution structures to a surface of the inductor, wherein the one or more thermal solution structures are thermally coupled to the inductor;

attaching a die to the substrate on a side of the substrate opposite the surface of the inductor;

attaching a board to the substrate; and forming at least one of a recess or an opening in the board, wherein at least one of the one or more thermal solutions extend at least partially into one of the recess or the opening.

14. The method of fabricating the microelectronic package structure of claim 13, wherein forming the inductor comprises forming a plurality of inductor layers within the substrate, wherein individual layers are coupled to each other by one or more via structures.

15. The method of fabricating the microelectronic package structure of claim 13 wherein attaching the one or more thermal solution structures comprises:

applying a solder material or a thermally conductive epoxy material on the surface of the inductor; and mounting the one or more thermal solution structures onto the solder material or onto the thermally conductive epoxy material.

16. The method of fabricating the microelectronic package structure of claim 13 further comprising:

attaching a socket onto the substrate, wherein the socket comprises a cavity;

attaching a board onto the socket, wherein the one or more thermal solution structures are at least partially extending into the cavity.

* * * * *